United States Patent [19]

Parham

[11] Patent Number: 5,805,860
[45] Date of Patent: Sep. 8, 1998

[54] METHODS, DATA STRUCTURES AND APPARATUS FOR TRAVERSING A HIERARCHICAL NETLIST

[75] Inventor: Darrell R. Parham, Sunnyvale, Calif.

[73] Assignee: Sun Microsystems, Inc., Mountain View, Calif.

[21] Appl. No.: 498,531

[22] Filed: Jul. 5, 1995

[51] Int. Cl.$^6$ ............................................. G06F 17/30
[52] U.S. Cl. .................. 395/500; 364/254.6; 364/283.2; 364/252.6
[58] Field of Search .................. 395/500; 364/488–491, 364/578

[56] References Cited

U.S. PATENT DOCUMENTS

| | | | |
|---|---|---|---|
| 5,111,413 | 5/1992 | Lazansky et al. | 364/578 |
| 5,212,650 | 5/1993 | Hooper et al. | 364/489 |
| 5,262,959 | 11/1993 | Chkoreff | 364/489 |
| 5,281,558 | 1/1994 | Bamji et al. | 437/250 |
| 5,528,508 | 6/1996 | Russell et al. | 364/488 |
| 5,581,474 | 12/1996 | Bamji et al. | 364/490 |

*Primary Examiner*—Gary Chin
*Assistant Examiner*—Ayni Mohamed
*Attorney, Agent, or Firm*—Hickman Beyer & Weaver, LLP

[57] ABSTRACT

The present invention teaches a variety of methods, data structures and apparatus for use in representing and traversing hierarchical netlists. According to a first embodiment of the present invention, a hierarchical netlist which represents an electronic device is stored in a computer readable medium and includes a module data structure and a hierarchical data structure. The module data structure includes a first module and a list identifying each instance of the first module present in the hierarchical netlist. The hierarchical point data structure represents a first hierarchical element in the hierarchical netlist and is arranged to identify a selected device element represented in the first module. Additionally, the hierarchical point data structure is capable of identifying a plurality of unique occurrences of separate but identical device elements that are represented by the first hierarchical element. Thus, if the selected device element has separate but identical occurrences in the electrical device which are interconnected appropriately therein, the hierarchical point data structure may be used to identify these separate but identical occurrences. In accordance with other aspects of the present invention, a variety of methods which utilize hierarchical data structures to initialize and traverse the hierarchical netlist are taught.

42 Claims, 17 Drawing Sheets

METHODS, DATA STRUCTURES AND APPARATUS FOR TRAVERSING A HIERARCHICAL NETLIST

BACKGROUND OF THE INVENTION

The present invention relates generally to netlist representations of electronic devices which are used in electronic computer aided design. More specifically, the present invention teaches netlist structures and traversal methods which allow a computer implemented application to traverse a hierarchical netlist.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with a representation of the hardware device. A "netlist" is one common representation of a hardware device. As will be appreciated by those skilled in the art of hardware device design, a "netlist" is a textual representation of the hardware device. A circuit designer may generate a netlist for a specific circuit using a variety of tools such as a text editor, a schematic capture package, or, most commonly, a synthesis package. For example, a netlist representation of an integrated circuit will list gates, interconnect wires, pins and any other devices in the circuit as well as define the interrelation of these components. Thus the netlist defines the integrated circuit.

Perhaps the two most common forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

Referring now to FIG. 1, one graphical representation 98 of a hierarchical netlist will be described. The graphical representation 98 includes a top level module 100 having a module_1 102 and a module_2 104 nested therein, an AND gate instance 106, net segments 108, an input port 110, and an output port 112. Modules such as module_1 102 typically have port instances such as port instance 114 for use in providing an electrical crossover of a hierarchical boundary. In this case, the port instance 114 allows an electrical interconnect between the top level net segment 108 and the module_1 102. Modules such as module_1 102 are a black box representation of the circuitry internal to the module. Net segments 108 represent the wiring which interconnects the ports of the instances and the top level module input/output ports.

To further clarify, some specific definitions will now be presented. In general, the types of elements which a hierarchical netlist utilizes to represent an electronic circuit are: ports, instances, port instances, and nets. By definition, an "instance" is a gate, module, or other block within some module. A "port" is an electrical interconnect between an instance and a level one up in the hierarchy. A "port instance" is a port on an instance within some module. A net is comprised of a set of electrically equivalent nets called net segments.

Turning next to FIG. 2, the hierarchical nature of hierarchical netlists will be further clarified through a description of a module_1 102'. In the example of FIGS. 1 and 2, the module_1 102' is the single copy of module_1 maintained by the hierarchical netlist. For example, if more than one instance of module_1 102' were required in the hierarchical netlist of FIG. 1, only one copy would be maintained in memory. Note that port instance 114 of FIG. 1 is represented as a port 114' in FIG. 2. Furthermore, module_1 102' includes net segments 108 interconnecting two AND gate instances 106 and a module_3 120.

The hierarchical nature is apparent as the example shown by FIGS. 1 and 2 has at least three different levels: a top level represented by the top level module 100, a second level represented by module_1 102 and module_2 104 nested within the top level module 100, and a third level represented by module_3 120 nested within module_1 102. It is noted that the top level is somewhat arbitrary as any module could be developed both for use by itself (wherein it would be the top level module) and also for use nested within another module.

Depending upon the requirements, both flat netlists and hierarchical netlists have their respective advantages. For example, hierarchical netlists have a very efficient structure for storing representations of circuit devices because of the potential for eliminating redundancy. Additionally, a designer may prefer using a hierarchical netlist as it may be easier to create a toolbox of frequently used modules for generating instances rather than repeating the work. However, for some E-CAD tools, especially simulation and analysis tools, a hierarchical netlist may be awkward (i.e. difficult to design for) and resource expensive to traverse. Therefore, when it is desired to analyze a hierarchical netlist, a flat netlist is created from the hierarchical netlist and presented to the E-CAD tools.

Unfortunately, creating a flat netlist from the hierarchical netlist is costly in terms of system resource utilization. For one, the flat netlist will require additional memory space. Furthermore, much of the created flat netlist may not be used because only a portion of the circuit device may be analyzed. For example, a circuit simulation may discover errors or potential problems in one region of the circuit device. An E-CAD analysis tool may then be used to analyze just that portion of the circuit device wherein there are problems. Thus much of the processing for creating a flat netlist is unnecessary processing. What is needed is a way to represent a hierarchical netlist so that an application program such as an E-CAD tool can traverse and search the hierarchical netlist as if it were a flat netlist.

SUMMARY OF THE INVENTION

In order to achieve the foregoing and in accordance with other objectives of the present invention, a variety of methods, data structures and apparatus for use in representing and traversing hierarchical netlists are disclosed.

According to a first embodiment of the present invention, a hierarchical netlist which represents an electronic device is stored in a computer readable medium and includes a module data structure and a hierarchical data structure. The electronic device has a multiplicity of device elements such as gates and logic blocks of device elements, all of which are represented in the hierarchical netlist through hierarchical elements. Each hierarchical element in the hierarchical netlist corresponds to one or more unique occurrences of separate but identical device elements. Furthermore, the hierarchical elements types include a) port, b) port instance, c) net segment, and d) instance. In explanation, hierarchical elements of type instance include instantiations of gates that correspond to associated device elements, and instantiations of modules that each correspond to an associated logic block of device elements represented as a plurality of hierarchical elements.

The module data structure includes a first module and a list identifying each instance of the first module present in the hierarchical netlist. Thus the module data structures serves to define the instances of the first module within the hierarchical netlist.

In turn, the hierarchical point data structure represents a first hierarchical element in the hierarchical netlist and is arranged to identify a selected device element represented in the first module. Additionally, the hierarchical point data structure is capable of identifying a plurality of unique occurrences of separate but identical device elements that are represented by the first hierarchical element. Thus, if the selected device element has separate but identical occurrences in the electrical device which are interconnected appropriately therein, the hierarchical point data structure may be used to identify these separate but identical occurrences.

In a related embodiment, the hierarchical point data structure includes a type field for indicating the type of the first hierarchical element, a parent module pointer field for indirecting to the first hierarchical element's parent module, an element pointer field for indirecting to the first hierarchical element in the hierarchical netlist, a unique point list for use in identifying the plurality of unique occurrences, and a bottom level flag for indicating whether the first hierarchical element is at a bottom of a traversable hierarchy of the hierarchical netlist.

In another related embodiment, the hierarchical netlist further includes a unique point data structure. The unique point data structure represents the selected device element and includes a pointer to the hierarchical data structure. Thus if the electronic device had a plurality of separate but identical occurrences of the selected device element, if unique point data structures existed for the plurality of occurrences, there would be a well defined one-to-one correspondence between occurrences and unique point data structures.

Additionally, if the type of the hierarchical element is net segment, then the unique point data structure further includes a net segment type field for indicating whether the net segment is a master, leaf, or standard net segment, and a leaves/master pointer field.

According to one aspect of the present invention, a method for initializing a hierarchical netlist in preparation for traversal includes providing the hierarchical netlist such that when one or more unique occurrences of separate but identical device elements exist in the electronic device, the hierarchical netlist maintains only a single definitive representation of the device elements. As a further step in initialization, the method also includes generating a single hierarchical point data structure for each hierarchical element in the hierarchical netlist.

A separate aspect of the present invention teaches a computer implemented method of traversing a netlist that is arranged to represent an electronic device having a multiplicity of device elements. The method requires providing the hierarchical netlist such that when one or more unique occurrences of separate but identical device elements exist in the electronic device, the hierarchical netlist maintains only a single definitive representation of the device elements. The method further requires creating a first hierarchical point data structure and a first unique point data structure that corresponds to a selected first unique device element. Additionally, the method teaches receiving an identifier indicative of the selected first unique device element in the electronic device, the selected first unique device element being associated with a first single definitive representation of the selected first device element.

In some related aspects, the hierarchical point data structure is created before the identifier is received, while in other related aspects the hierarchical point data structure is created in response to receiving the identifier.

In one related aspect, a request is received from a client to generate an element list for a net segment, the element list for the net segment being a type chosen from the group including port, port instance, net, and instance, a traversal direction for the element list being chosen from the group consisting of next elements, previous elements, and a combination of next and previous elements. In response, the method teaches performing the steps of generating the requested element list for the net segment, and returning the requested element list for the net segment to the client.

In some other aspects of the present invention, a request is received from a client to generate an element list for a port, a port instance, and an instance, respectively. In each of these aspects, the present invention further teaches the steps required to generate and return the requested element list.

DETAILED DESCRIPTION OF THE PREFERRED EMBODIMENTS

Figure 1:
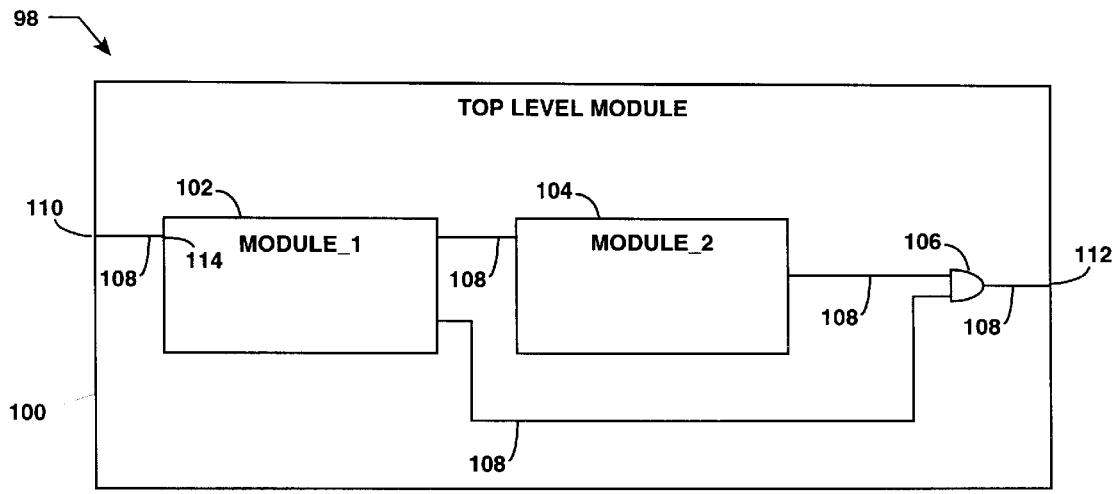
FIG. 1 is a graphical illustration of a first hierarchical netlist having a top level module and a couple of modules nested within the top level module.
Figure 2:
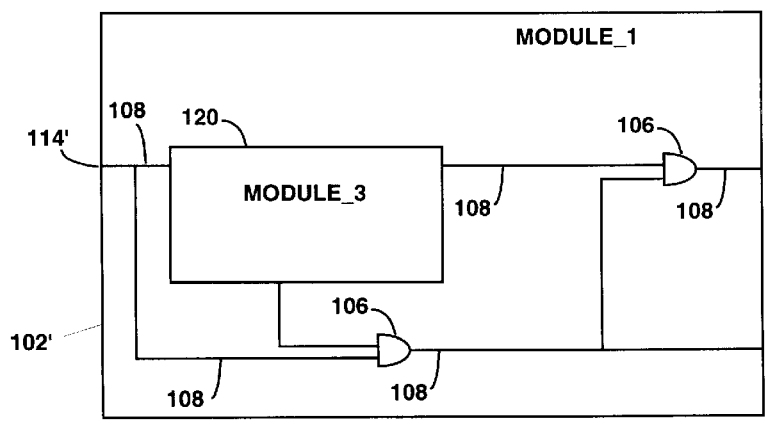
FIG. 2 is a graphical illustration of nested module_1 shown in the first hierarchical netlist of FIG. 1.
Figure 3:
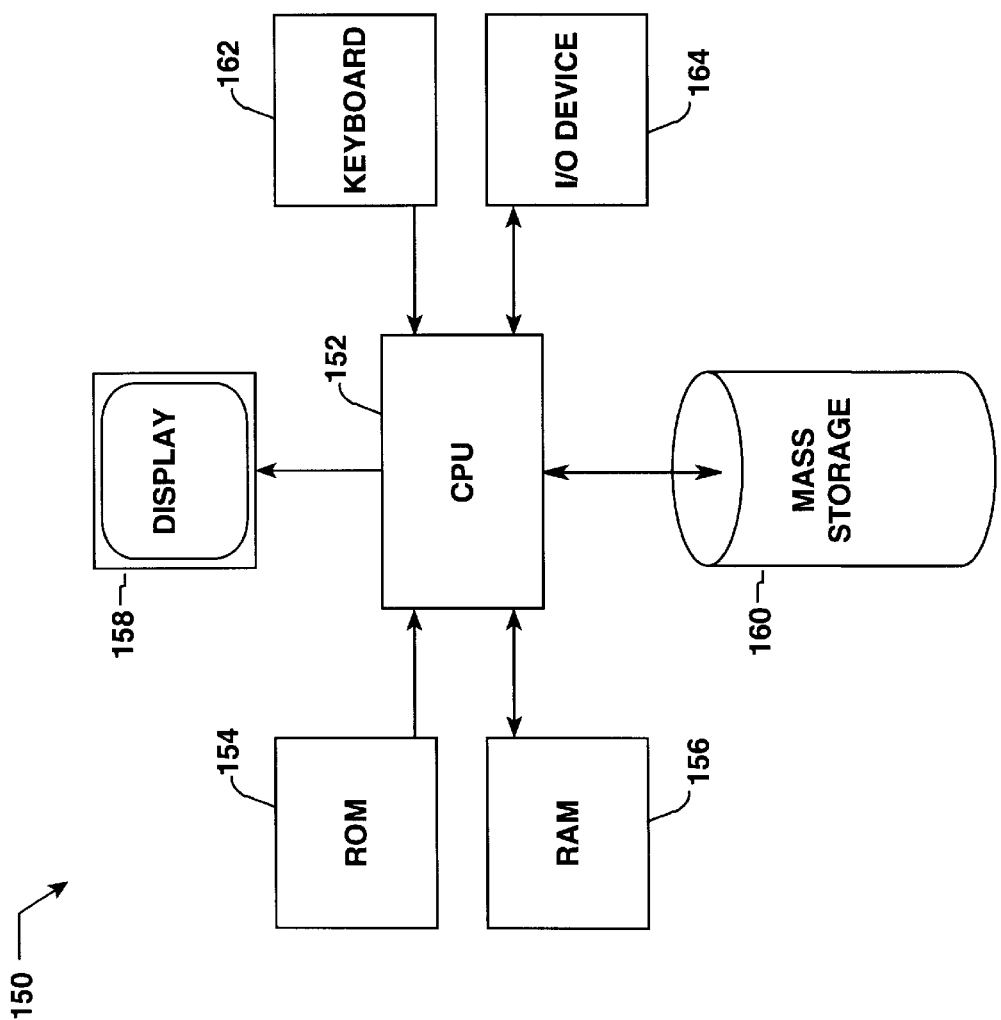
FIG. 3 is a diagrammatic illustration of a computer system for use in implementing a number of embodiments of the present invention.

Referring initially to FIG. 3, a number of embodiments of the present invention are implemented on computer systems such as computer system 150. The computer system 150 includes a central processing unit (CPU) 152, a read only memory (ROM) 154 coupled with the CPU 152, a random access memory (RAM) 156 coupled with the CPU 152, a computer display 158, a mass storage device 160, a keyboard 162, and additional I/O devices such as I/O device 164. Note that CPU 152 includes any circuitry and devices necessary to properly interface and control the components with which it is coupled. Design and construction of computer systems such as computer system 150 will be well familiar to those skilled in the art.

Figure 4:
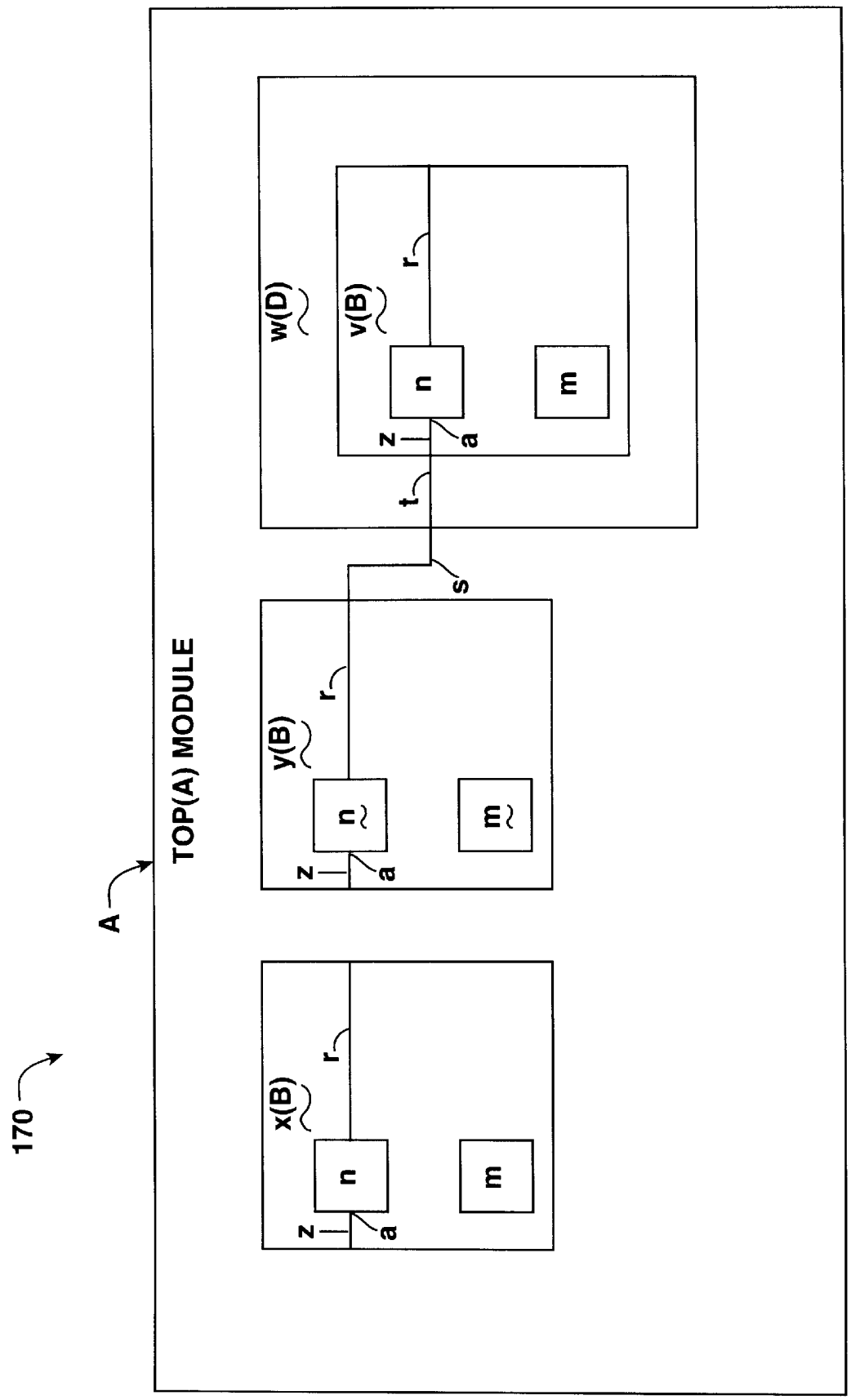
FIG. 4 is a graphical illustration of a second hierarchical netlist wherein elements of the hierarchical netlist adhere to a hierarchically nested naming convention in accordance with one aspect of the present invention.

With reference to FIG. 4, a graphical illustration 170 of a hierarchical netlist having a top level module A will be described. The top level module A includes two instances x(B) and y(B) of a parent module B, an instance w(D) of another parent module D, and a net segment s. In turn, the module w(D) includes an instance v(B) of the module B and a net segment t. Thus the hierarchical netlist A has three instantiations of the module B, two which are nested in top level module A and another which is nested in instance w(D). As shown, the module B (and accordingly the instantiations of module B: instances x(B), y(B), and v(B)) includes two instances n and m, a net segment z, a net segment r, and a port instance a.

With further reference to FIG. 4, a hierarchically nested naming convention for naming elements of a hierarchical netlist in accordance with one aspect of the present invention can now be described. In a first example of the hierarchically nested naming convention, the instance n nested in instance y(B) would be named "A.y.n." By way of contrast, the instance n which is nested in v(B) would be named "A.w.v.n." Similarly, the net segment z found in instance y(B) would be named "A.y.z" while the net segment z found in instance v(B) would be named "A.w.v.z." Thus an element name defines both the instances in which the element is nested and the hierarchy of the nesting.

By way of a more general explanation, the described naming convention begins with the top level module and generates an element's name by successively appending a delimiter (in this embodiment a period) and the name of the next level instance until the module containing the desired element is reached, at which point a delimiter and the non-hierarchical name of the element is appended.

As will be appreciated, there exist a variety of hierarchical naming conventions which are suitable for the present invention. For example, both (a) whether the order of the name is descending or ascending (e.g. "A.y.z" versus "z.y.A") and (b) what character is used as the delimiter are arbitrary. Also, a the name of the top level is superfluous. Thus "A.y.z" is no more definitive than "y.z." In any event, the naming convention must be defined a priori and thereafter used consistently.

In order to enable traversal of a hierarchical netlist without flattening the hierarchical netlist, the present invention teaches representing the hierarchical netlist and its corresponding elements through a variety of data structures as will be described below with reference to FIGS. 5–10. These data structures may be selectively created during execution of a hierarchical netlist traversal, as will be described with reference to FIGS. 11–25.

Prior to discussing the data structures of FIGS. 5–9, a number of definitions are required. A "device element" is defined as a physical element in an electronic device. Some example device elements include gates, resistors, capacitors, inductors, diodes, transistors, amplifiers. As will be apparent to those skilled in the art, the preceding list is not by any means exhaustive, but is rather intended to be representative. Additionally, a device element is defined herein to further include a logic block of interconnected device elements. As will be appreciated by those skilled in the art, a module is one hierarchical representation of such a block of interconnected device elements.

A "hierarchical point", "h-point", or "hierarchical element" is a "point" (i.e. element) in the hierarchical netlist. Hence an h-point corresponds to one or more unique occurrences of identical but separate (often referred to herein as "unique") device elements of the "real-world" electronic device which the hierarchical netlist represents. Thus, in defining the hierarchical netlist, an h-point may represent one or more unique net segments, port instances, ports or instances.

To further clarify, an "instance" is an instantiation of a device element (with the exception of ports, port instances, and net segments) within another module. An instance will typically have port instances associated with it as port instances are the means for an instance to interface with the rest of the hierarchical netlist. It should be noted that an instance does not specify the contents of its corresponding gate, block, module, etc.

In the described embodiments, h-points exist only within hierarchical netlists. Note that since network analysis applications typically work with a flat netlist representation, h-points are not normally used by network analysis applications. However, as disclosed by the present invention, h-points are used by netlist utilities in performing their functions, particularly that portion of functionality involving netlist traversal.

A "unique point", "u-point", or "flattened element" is a unique "point" (i.e. unique element) in the netlist. Thus a u-point corresponds to one (and only one) distinct element of the electronic device which the hierarchical netlist represents. For example, each point (element) in a flat netlist is unique. Therefore each point in a flat netlist is a u-point. On the other hand, a hierarchical netlist by definition may contain elements which are not unique. By way of example, there may be more than one instance of a module within a given hierarchical netlist, but the hierarchical netlist will only maintain one copy of the module. In contrast, the equivalent flat netlist representation would maintain a unique copy of the module for each occurrence within the netlist.

Figure 5:
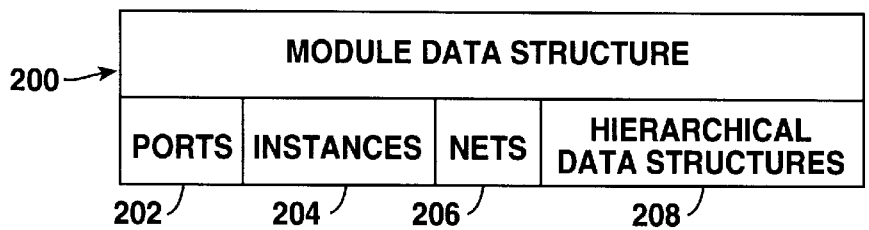
FIG. 5 is a diagrammatic illustration of a module data structure in accordance with one embodiment of the present invention, the module data structure including ports, instances, nets, and a list of hierarchical data structures.

With reference to FIG. 5, a module data structure 200 in accordance with the present invention will now be described. The module data structure 200 represents a module and includes ports 202, instances 204 and nets 206. The information found in ports 202, instances 204 and nets 206 is the information found in the original hierarchical netlist which represented the module (i.e., a logic block of device elements). Therefore it includes the appropriate layout and interconnection between the elements. In addition, the module data structure 200 includes a list of the hierarchical data structures 208 (or a list of pointers to the hierarchical data structures). The list 208 defines instances of the module which are present in the complete hierarchical netlist. Hierarchical data structures will be described below with respect to FIG. 6.

It should be noted that in the following discussion, the modifying term "parent" is used in two different senses. In the first sense, when referring to an element within a given module, but not considering the element's role in the full circuit design, a "parent module" of the element refers to the definition of the module in which the element is contained. Thus the term "parent" stems from the notion that the element, in essence, originates from the parent module. By way of example, element 224 of FIG. 7 utilizes this definition. In the second sense, when referring to an element's role in the full design, the "parent u-point" is the u-point of an instance of the module in which the element is contained. That is, the instance of the module which the parent u-point indirects to is one level higher up in the hierarchy of the design. By way of example, element 217 of FIG. 6 uses this sense. As will be appreciated, which meaning of the modifier "parent" applies will be clear from the context in which it is used.

Figure 6:
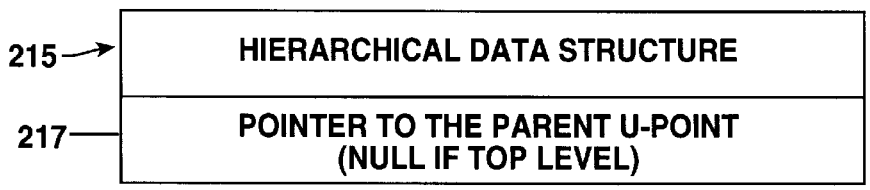
FIG. 6 is a diagrammatic illustration of a hierarchical data structure in accordance with another embodiment of the present invention.

Turning next to FIG. 6, a hierarchical data structure 215 in accordance with one embodiment of the present invention will be described. The hierarchical data structure 215 includes a pointer 217 to the parent instance u-point; the pointer 217 is null if the element is directly contained in the top level module. As will be appreciated, the hierarchical data structure 215 is equivalent to the parent instance u-point pointer and therefore may be eliminated and the parent instance u-point pointer used directly. However, as those skilled in the art of computer programming will appreciate, the hierarchical data structure 215 provides more flexibility enabling additional data fields and structural changes. It should be noted that the terms "h-data structure" and "hierarchical data structure" are used interchangeably throughout the detailed description.

Figure 7:
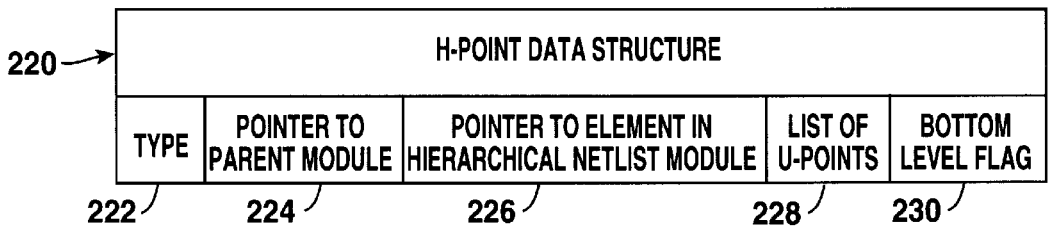
FIG. 7 is a diagrammatic illustration of a hierarchical point data structure in accordance with yet another embodiment of the present invention.

In reference to FIG. 7, an h-point data structure 220 in accordance with one embodiment of the present invention will be described. As will be appreciated, the h-point data structure 220 is a representation of an h-point. Accordingly, herein the terms "h-point" and "h-point data structure" are used interchangeably. The h-point data structure 220 includes a type field 222, a parent module pointer 224, an element pointer 226, a u-point list 228, and a bottom level flag 230. The type field 222 contains a value which indicates the element type of the h-point 220. The possible types include a net segment, a port, a port instance, and an instance. The value may be a string, a numerical representation, or any other appropriate representation.

The parent module pointer 224 is a pointer which indirects to the h-point's parent module, that is, the definition of the module that contains the h-point. By way of example, a parent module pointer 224 for the instance A.y.n of FIG. 4 would point to module B, as element A.y.n is contained in y(B), an instance of module B. In another example, a parent module pointer 224 for the net segment A.w.v.z of FIG. 4 would also point to the module B, as element A.w.v.z is contained in v(B), another instance of module B. As a final example, a parent module pointer 224 for the instance A.x would point to top level module A.

The element pointer 226 is a pointer which indirects to the element in the corresponding original hierarchical netlist module. The u-point list 228 includes u-points corresponding to the h-point for the h-point data structure 220. According to described embodiments, when the h-point data structure 220 is initially created the u-point list 228 is generated as an empty list. Subsequently, during traversal of the hierarchical netlist, u-points will be encountered and appropriate u-point data structures created; at this point the encountered u-point(s) are added to the u-point list 228.

The bottom level flag 230 is always present but only used in the described embodiments if the type field 222 indicates that the h-point type is instance. If the h-point type is instance and if the instance does not contain other instances, then the bottom level flag 230 is set to indicate that this instance is a bottom level instance. As should be apparent, unless an instance is an instantiation of a module, it will be a bottom level instance. Additionally, within some applications, it may be desirable for the user to define some modules to behave as bottom level instances. In one suitable method for accomplishing this, the traversal utility of the present invention may accept a "stoplist", a "stoplist" being a list of modules to stop at when flattening the hierarchy of the hierarchical netlist.

Figure 8:
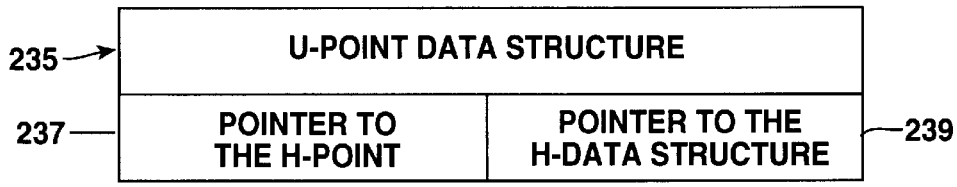
FIG. 8 is a diagrammatic illustration of a unique point data structure in accordance with a further embodiment of the present invention.

With reference to FIG. 8, a u-point data structure 235 for ports, port instances, and instances according to one embodiment of the present invention will now be described. In explanation, the u-point data structure 235 corresponds to a u-point. The u-point data structure 235 includes an h-point pointer 237 and a h-data structure pointer 239. The h-point pointer 237 is a pointer which indirects to the h-point data structure 220 for the module to which the u-point corresponds. Similarly, the h-data structure pointer 239 is a pointer which indirects to the h-data structure 215 to which the u-point corresponds. As discussed above with reference to FIG. 6, the h-data structure pointer 239 may also be the parent u-point pointer 217.

Figure 9:
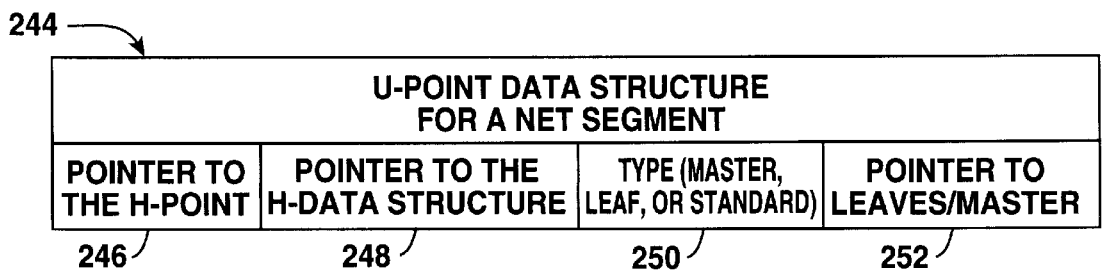
FIG. 9 is a diagrammatic illustration of another unique point data structure in accordance with a still further embodiment of the present invention.

Turning next to FIG. 9, a u-point data structure 244 for a net segment according to another embodiment of the present invention will be described. The u-point data structure 235 of FIG. 8 is sufficient for use in describing ports, port instances, and instances. However, to enable proper traversal involving net segments, the u-point data structure 244 for a net segment includes an h-point pointer 246, an h-data structure pointer 248, a net segment type field 250, and a leaves/master pointer 252. The h-point pointer 246 and the h-point data structure pointer 248 fulfill analogous purposes as the h-point pointer 237 and the h-data structure pointer 239 of FIG. 8.

The net segment type field 250 contains a value indicative of the type of the net segment: master segment, standard segment, or leaf segment. The information stored in the leaves/master pointer 252 varies depending upon the type of the net segment. If the net segment is a master segment for a set of equivalent net segments, then the leaves/master pointer 252 contains a list of pointers to all the leaf segments of the net segment. However, if the net segment is a standard segment or a leaf segment, the leaves/master pointer 252 is simply a pointer to the master segment. Nets and the segments comprising a net will be described in more detail below with respect to FIG. 10.

Figure 10:
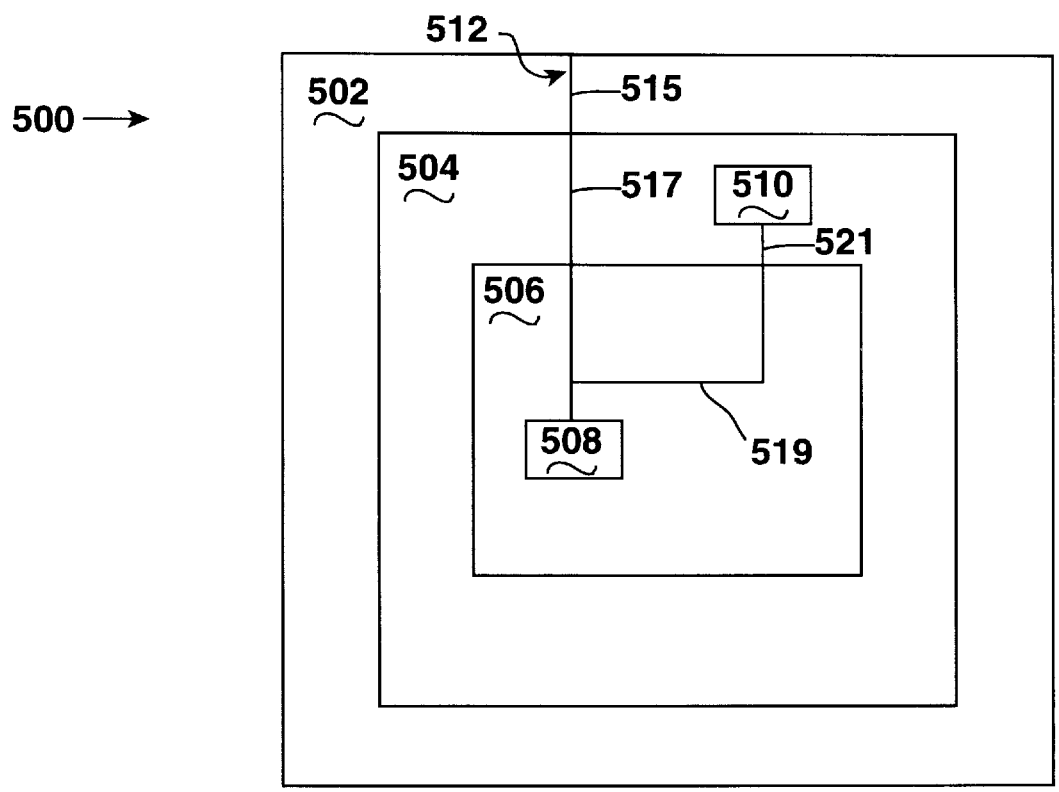
FIG. 10 is a graphical illustration of a third hierarchical netlist, the third hierarchical netlist demonstrating the different types of net segments in accordance with one embodiment of the present invention.

By referring to FIG. 10, a hierarchical netlist 500 demonstrating master, standard and leaf segments of a net in accordance with one embodiment of the present invention will be described. The hierarchical netlist 500 includes top level module 502, module 504, module 506, module 508, module 510 and net 512. Net 512 is comprised of a set of equivalent nets called net segments 515, 517, 519, and 521. These net segments are equivalent because, even though they would have different names, each of these segments are electrically equivalent. By way of example, using the reference numerals for the hierarchically nested naming convention, the net segment named 502.515 would be electrically equivalent to the net segment named 502.504.506.519.

The different types of net segments are defined as follows. Each net has a single master segment chosen from the net segments found in the highest level of the hierarchy in which the net appears. For example, in FIG. 10 the net segment 515 would be the master net segment of net 512. In this instance, net 512 only has a single segment present in the top level module 502. Thus the net segment 515 is the master segment by default. Typically the rule for selecting (among eligible net segments) which segment is the master segment is not important to the subsequent analysis of the hierarchical netlist and thus may be arbitrary. However, a more sophisticated selection may be implemented to insure selection consistency or some other desired outcome.

By definition, a top net segment is one that is either in the top level module or does not connect to a port in its module. Once all the top net segments for a specific net have been determined, the master net segment is selected from the list of top net segments. Then, all net segments remaining in the list of top net segments are identified as leaf net segments. For instance, the only leaf segment in FIG. 10 is net segment 521. Standard segments are determined as those segments of the net which are neither the master segment nor leaf segments. Therefore it should be apparent that the standard segments of net 512 are net segments 517 and 519.

Figure 11:
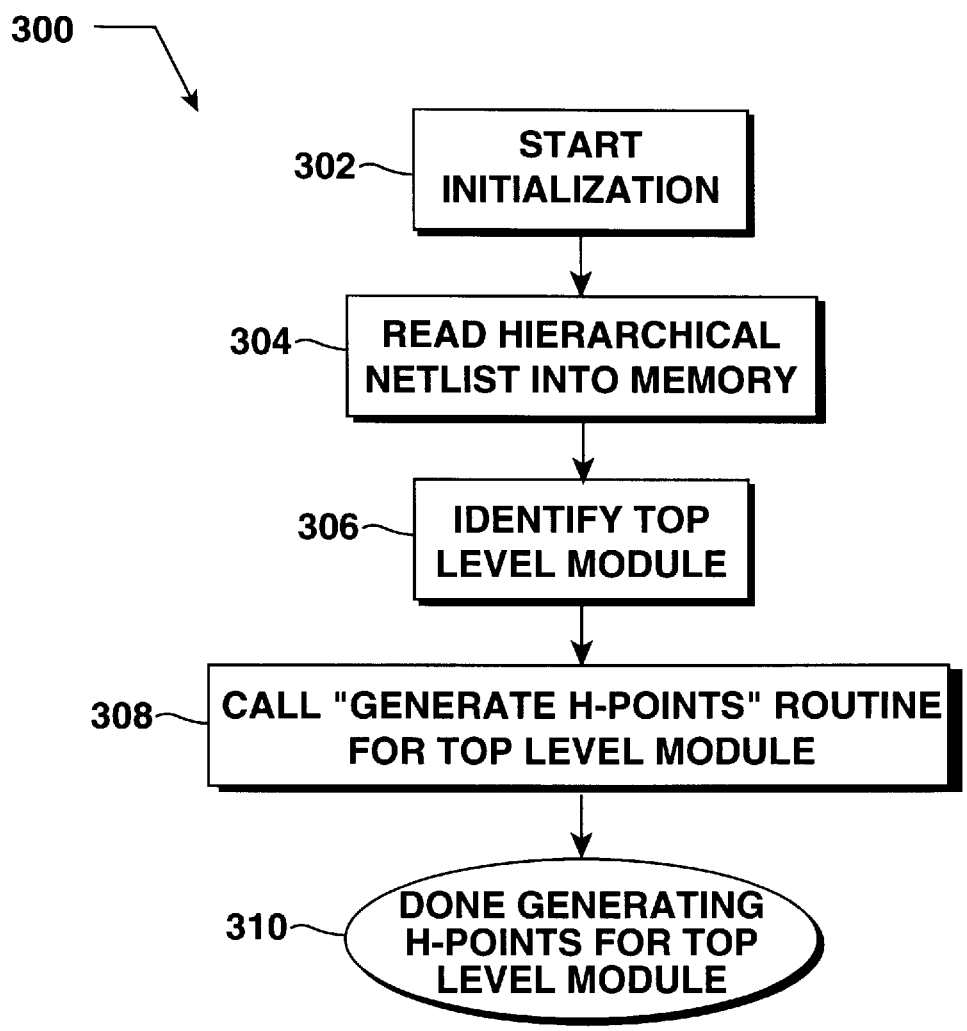
FIG. 11 is a flow chart illustrating a method for initializing a hierarchical netlist in preparation for traversal in accordance with one aspect of the present invention.

Turning next to FIG. 11, one method 300 for initializing a hierarchical netlist in preparation for traversal in accordance with one aspect of the present invention will now be described. The method 300 begins in a start initialization step 302. Step 302 occurs in response to an appropriate action such as a netlist analysis application requesting that a specific netlist be prepared for traversal or the netlist traversal utility receiving an actual hierarchical netlist traversal request. In any event, in preferred embodiments the type of the netlist (i.e. hierarchical or flat) is transparent to any applications which need to traverse the netlist.

Step 304 responds to step 302 by reading a netlist into memory. This netlist may be either a hierarchical netlist or a flat netlist. However, since the interesting and more complex situation is when the netlist is a hierarchical netlist, the following discussion will focus on the hierarchical netlist case. Nevertheless, as will be apparent to those skilled in the art, the methods of the present invention will accurately traverse a flat netlist. As an overview, the following methods will generate data structures including h-point and u-point data structures to enable netlist traversal without flattening. In the case of a flat netlist, each h-point will contain only a single u-point.

A next step 306 identifies the top level module of the hierarchical netlist. Recall that the top level module is the top hierarchical level and, while it includes the entire circuit, in a way it shows the least detail of the internals of the circuit. Once the top level module is identified in step 306, a step 308 calls a "generate h-points" routine for the top level module. One method 350 for generating h-points for a given module or instance will be described in more detail below with reference to FIG. 12.

After the appropriate data structures for the top level module have been generated, the initialization method 300 is complete in a step 310. Step 310 may perform appropriate final steps such as sending an initialization complete message to the calling application or netlist utility. Additionally, if the method 300 was performed in response to a specific traversal request, step 310 may initiate this search.

As will be apparent from the following discussion, a rudimentary step in the subsequent hierarchical netlist traversals is generating the appropriate data structures for the top level module. Thus steps 306 and 308 may be performed initially even when there is not a specific hierarchical netlist traversal request pending. However, in other suitable embodiments, steps 306 and 308 may be performed only after an actual hierarchical netlist traversal request has been made. As a result the initialization procedure would require less time but the first hierarchical netlist traversal would require more time.

Figure 12:
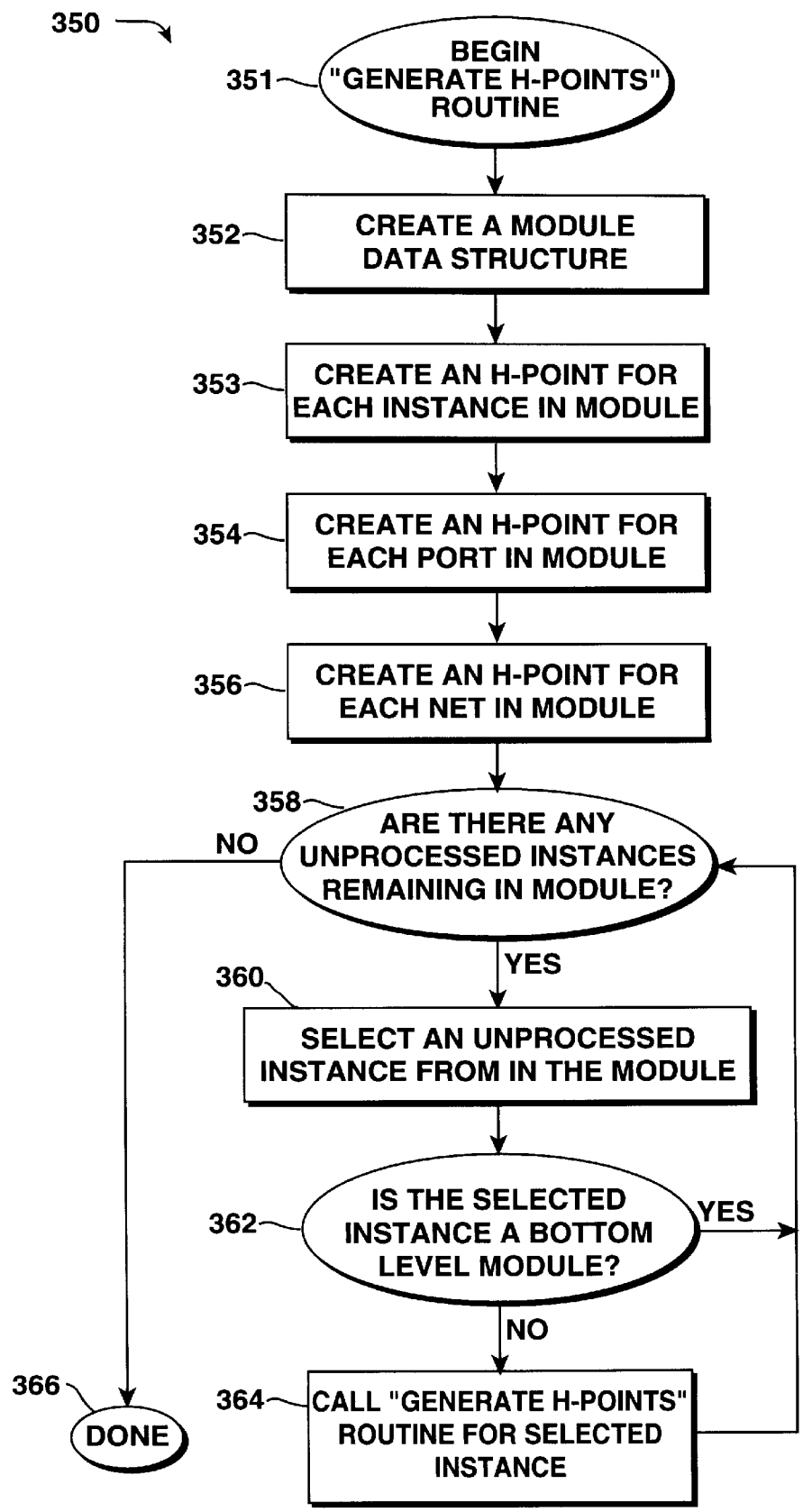
FIG. 12 is a flow chart illustrating a method for generating the hierarchical point data structures for a given module in accordance with another aspect of the present invention.

With reference to FIG. 12, one method 350 for generating the h-points of a given module in accordance with one aspect of the present invention will be described. The method 350 begins in a step 351. In the embodiment of FIG. 12, method 350 is envisioned as a routine which is a component of the netlist traversal utility. Step 351 includes receiving the necessary information regarding the given module. This may include a pointer to the hierarchical netlist and a pointer to the specific module. Step 351 is followed by a step 352 which creates a module data structure 200 for the given module. The module data structure 200 will include all the original hierarchical netlist information for the given module as well as an empty hierarchical data structure list 208.

A next step 353 creates an h-point for each instance and each port instance in the given module. In essence step 353 entails allocating memory for and generating an h-point data structure 220 of FIG. 7 for each instance or port instance. The type field 222 will be set to indicate instance or port instance. The parent module pointer 224 will be initiated to indirect to the given module. The element pointer 226 will be initiated to indirect to the corresponding element in the original hierarchical netlist. The u-point list 228 will be initiated to a null list (this will get filled as needed during subsequent hierarchical netlist traversals). Finally, the bottom level flag 230 will be set to indicate if this instance is a bottom level instance.

As will be appreciated, it makes sense to simultaneously create h-points for instances and port instances, as done in step 353. This is because a port instance data structure is typically stored with the instance so the way to find a port instance involves first finding the corresponding instance. Thus looping through the port instances while looping through the instances is a logical optimization. Nevertheless, it is suitable to divide step 353 into two independent steps as the final result is the same.

A subsequent step 354 creates an h-point for each port in the given module. In essence step 354 entails allocating memory for and generating an h-point data structure 220 of FIG. 7 for each port. The type field 222 will be set to indicate port. The parent module pointer 224 will be initiated to indirect to the given module. The element pointer 226 will be initiated to indirect to the corresponding port in the original hierarchical netlist. The u-point list 228 will be initiated to a null list (this will get filled as needed during subsequent hierarchical netlist traversals). Finally, the bottom level flag 230 will be set to indicate that the given port is not a bottom level instance.

Following step 354, a subsequent step 356 creates an h-point for each net segment in the given module. In essence step 356 entails allocating memory for and generating an h-point data structure 220 of FIG. 7 for each net segment. The type field 222 will be set to indicate net. The parent module pointer 224 will be initiated to indirect to the given module. The element pointer 226 will be initiated to indirect to the corresponding net segment in the original hierarchical netlist. The u-point list 228 will be initiated to a null list (this will get filled as needed during subsequent hierarchical netlist traversals). Finally, the bottom level flag 230 will be set to indicate that the given net segment is not a bottom level instance.

As will be appreciated, the sequence of execution of steps 353, 354, and 356 is not relevant to the present invention. For example, the order could equivalently be (a) step 356, step 354, and then step 353 or (b) step 354, step 353, step 356. This is because none of these steps are prerequisites for one another.

After the data structures for each instance, port instance, port, and net at the level of the given module have been created, step 358 determines if there are any unprocessed instances remaining in the given module. In the described method 350, an unprocessed instance is one for which the "generate h-points" routine has not been called for any instantiation of the corresponding module. As will be apparent, even if a specific instance has not been selected and processed, another instantiation of the module may have been selected and processed, thereby generating the necessary data structures. When there is at least one remaining unprocessed instance in the given module, the method continues with a step 360.

Continuing on, step 360 selects an unprocessed instance from within the given module. Step 362 determines if the selected instance is (or should be treated as) a bottom level instance. That is, does the module corresponding to the selected instance contain other instances? Additionally, within some applications it may be desirable for the user to define certain modules to behave as bottom level instances even if they contain instances. In one suitable method for accomplishing this the traversal utility of the present invention may accept a "stoplist", a "stoplist" being a list of modules to stop at when flattening the hierarchy of the hierarchical netlist. As the h-point for the selected module was created in step 353, the determination of step 362 may be accomplished by simply evaluating the corresponding bottom level flag 230.

If the bottom level flag indicates that the selected instance is a bottom level instance, then control loops back to step 358 where, once again, it is determined if any unprocessed instances remain in the current given module. However, if the selected instance is not a bottom level instance (i.e. the corresponding module contains instances and it's not in the stoplist), then control is passed to a step 364.

In turn, step 364 performs a recursive call to the "generate h-points" routine for the selected instance. In essence, a new implementation of method 350 will begin generating h-point data structures for any ports, instances and nets found in the module associated with the selected instance. Note that, while an instance by definition does not define the instances contained therein, when method 350 is called, it is the associated module which is analyzed. As will be apparent to those skilled in the art of computer programming, the recursive call of step 364 implies that calling the method 350 for a top level module of a hierarchical netlist results in all the h-point data structures for the hierarchical netlist being created. When the recursive call of step 364 is complete, control returns to the present method 350 and then to step 358.

Once step 358 determines that all the instances in the given module have been processed, the method 350 is completed in a step 366. Step 366 will return control to its requesting client. By way of example, the present implementation of method 350 may have been executed in response to a recursive call such as step 364. Thus control would pass back to the calling client of step 364. However, this may be the "final" step 366 and control may pass back to an initialization routine such as method 300 of FIG. 11.

With respect to FIG. 13, one method 370 for creating an h-point data structure 220 for any type of netlist element in accordance with one aspect of the present invention will now be described. The method 370 is suitable for use as a generic method in performing steps such as steps 353, 354, and 356 of FIG. 12. For example, step 353 may perform method 370 for each instance present in the given module.

In an initial step 372 of method 370, a request is received to create an h-point data structure for a specific type of netlist element (port, port instance, instance, and net segment). In response, step 372 allocates the appropriate space in memory and assigns it to the present h-point. Thus, after step 372, a new, non-initialized, h-point data structure 220 having a type field 222, a parent module pointer 224, an element pointer 226, a u-point list 228, and a bottom level flag 230, is resident in memory.

Once the new, non-initialized, h-point data structure 220 is created in step 372, a step 374 stores the h-point type into the type field 222. Then a step 376 stores a pointer to the parent module in the parent module pointer 224. Next a step 378 stores a netlist data pointer which corresponds to the data structure in the hierarchical netlist into the element pointer 226. Then, a step 380 creates a null u-point list 228. And finally, if the h-point type is instance and if the module definition (i.e. the single copy maintained by the original hierarchical netlist) does not contain other instances (or is listed in the stoplist), then the bottom level flag 230 is set to indicate that the module which corresponds to the h-point data structure 220 is a bottom level module. As will be apparent, the sequence of steps 374–382 as described may vary without altering the outcome of method 370. Therefore other embodiments of the present invention may suitably exhibit variations of the ordering of the steps of method 370.

Figure 13:
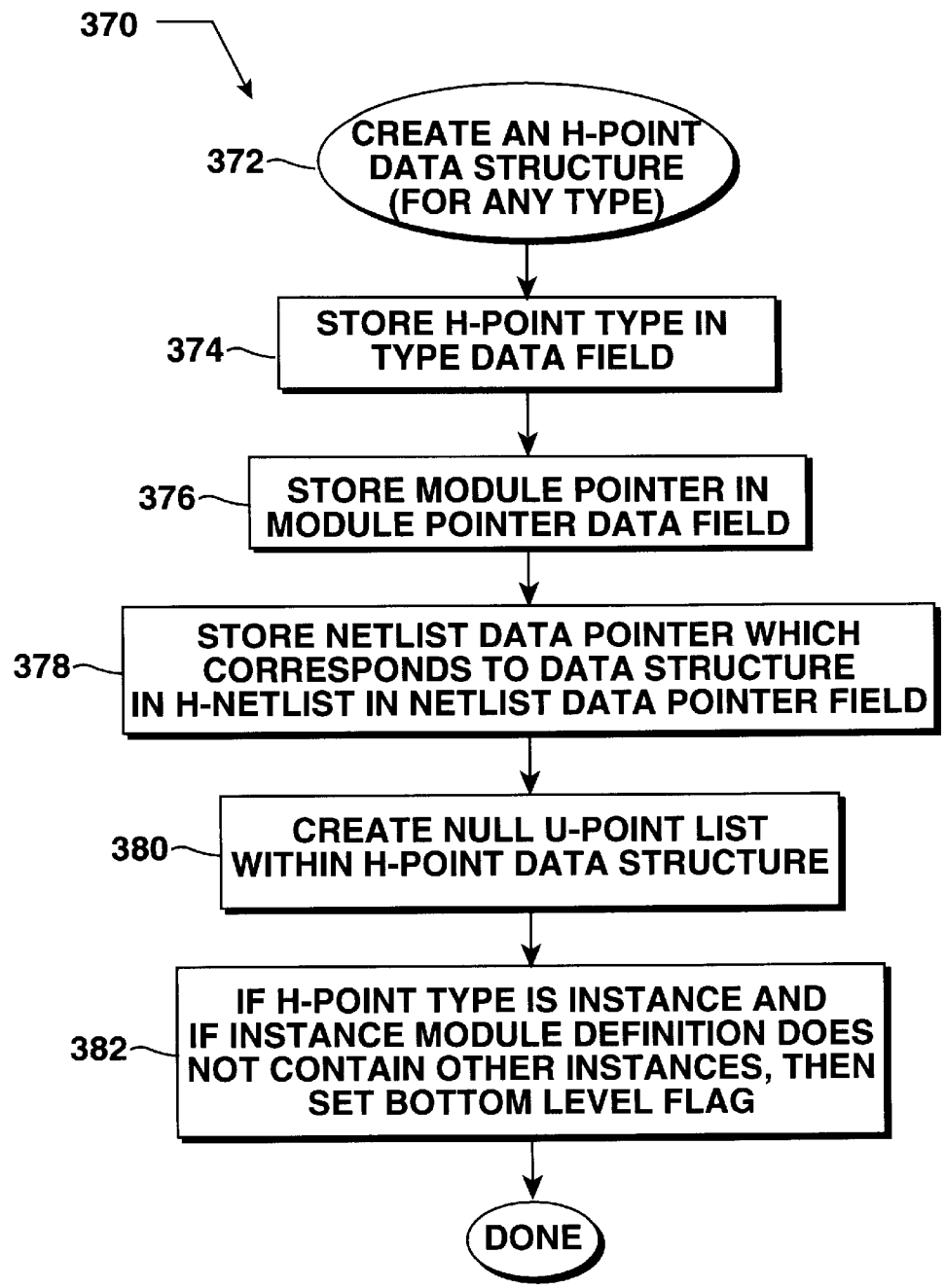
FIG. 13 is a flow chart illustrating a method for creating a hierarchical point data structure for a hierarchical element in a hierarchical netlist in accordance with one aspect of the present invention.

As will be apparent to those skilled in the art, an appropriate application of the methods described in FIGS. 11–13 will read the desired hierarchical netlist into memory and generate initialized h-point data structures for the hierarchical netlist.

Figure 14:
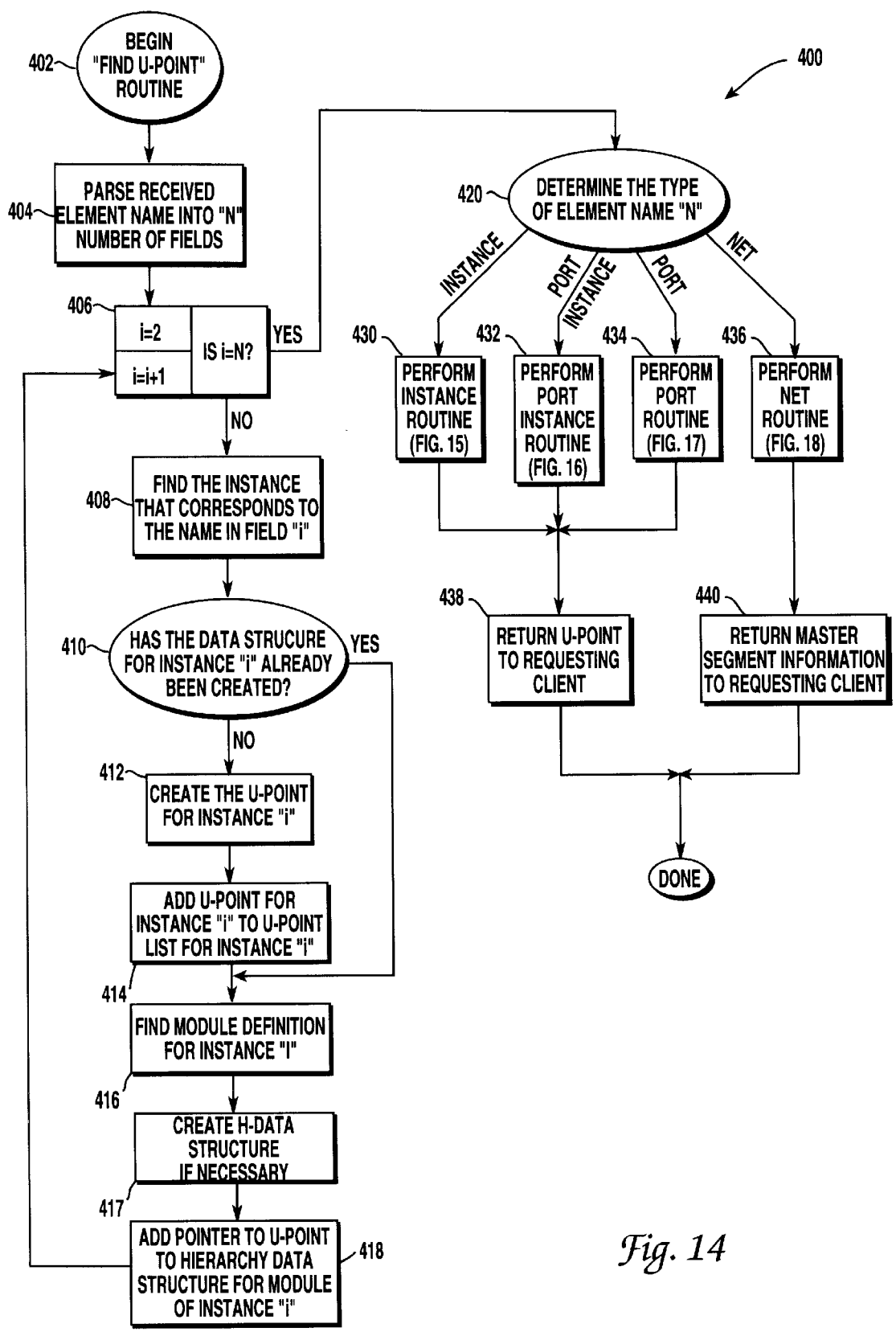
FIG. 14 is a flow chart illustrating a method for traversing a hierarchical netlist in accordance with one embodiment of the present invention, the traversal operable to find a given unique point within the hierarchical netlist.

Turning next to FIG. 14, a netlist traversal method 400 for finding a unique point (u-point) within a netlist in accordance with one aspect of the present invention will be described. Method 400 begins with a step 402 receiving a request to find a specific element within the netlist, the element named according to the hierarchically nested naming convention described above with respect to FIG. 4. After receiving the name, a step 404 parses the received element name into an integer "N" number of fields, eliminating the delimiters in the process. That is, N fields each consisting of one non hierarchical name would be created.

With reference to an example given previously with respect to FIG. 4, the instance n found in instance y(B) would be named "A.y.n." In this case, step 404 parses "A.y.n" into three (hence N=3) fields: field 1 ="A"; field 2 ="y"; and field 3 ="n."

Following the parsing in step 404, a loop control step 406 begins a looping process by setting an index variable i equal to 2. Starting with i=2 effectively skips processing of the top level module (top level processing being unnecessary). Step 406 then determines if i is equal to N. A next step 408 finds the module that corresponds to the name in field "i" (instance "i"). As will be appreciated, the name corresponding to a field whose value is less than N will always be a nested instance or the top level module.

Then, a step 410 determines if a u-point data structure 235 for the instance "i" is already created. As will be apparent, a previous execution of method 400 (or an equivalent method) may have generated the u-point data structure for the instance "i." If so, then steps 412 and 414 are skipped and control is passed directly to a step 416.

However, if the u-point data structure 235 for the instance "i" has not been created, then the method proceeds in a step 412 to create the u-point for instance "i." Step 412 includes allocating space in memory and setting an h-point pointer 237 and an h-data structure pointer 239 to indirect to their respective data structures. According to the described embodiments of the present invention, the h-point data structure is created prior to step 412. In these embodiments step 412 simply consists of storing known pointer values into the u-point data structure 235. However, in other embodiments, the h-point data structure may not be created prior to step 412. Accordingly, in these embodiments, step 412 would include the steps necessary to create the corresponding h-data structure and h-point data structure.

In any event, after the u-point data structure 235 is created, a step 414 adds a pointer to the u-point data structure 235 into the u-point list 228 of the corresponding h-point data structure 220. Then, a step 416 finds the module definition for the instance "i." A step 417 then evaluates the module for instance "i" and, if necessary, creates an h-data structure and adds it to the corresponding module data structure. Next, a step 418 stores a pointer to the u-point 235 in a u-point pointer field 217 of a corresponding h-data structure 215. After step 418, the necessary data structures for the instance "i" have been created, the corresponding h-point data structure 220 and h-data structure 215 were created if necessary, and, further, the data structures have been updated accordingly. Execution then proceeds to loop back to step 406 wherein the index variable "i" is incremented by unity and once again it is determined whether "i" is equal to N.

After each of the modules prior to instance "N" have been processed through appropriate repetition of steps 408–418, step 406 will pass execution control to a step 420. Step 420 will determine the type of the element named "N" and control will proceed along one of four possible branches: instance; port instance; port; and net, depending upon the element type.

Following the instance branch out of step 420, a step 430 performs an "instance" routine. Traveling down the port instance branch of step 420, a step 432 performs a "port instance" routine. Traveling down the port branch of step 420, a step 434 performs a "port" routine. And finally, traveling down the net branch of step 420, a step 436 performs a "net" routine. Each of these routines will create the necessary data structures for the element named "N." More detailed descriptions of suitable embodiments for each of steps 430, 432, 434, and 436 are provided below with reference to FIGS. 15, 16, 17 and 18, respectively.

Proceeding after any one of the steps 430, 432, and 434, method 400 continues in a step 438 which returns the u-point requested by the client in the initial step 402. On the other hand, proceeding after the "net" routine of step 436, method 400 continues in a step 440 which returns master net segment information to the requesting client. As will be apparent, since the master segment contains information regarding all the segments and is, further, electrically equivalent to the requested net segment, returning the master net segment is sufficient and appropriate. In either case, after the desired information has been returned to the requesting client, the method 400 is complete.

In reference to FIG. 15, one suitable method for performing "instance" routine step 430 of FIG. 14 will now be described. An initial step 450 finds the instance which corresponds to the element named "N" (hereinafter termed the given instance). Then, a step 452 determines if a u-point data structure 235 has already been created for the given instance. In explanation, a previous request for this or a different element may have created the desired u-point data structure 235. If so, step 430 is complete as it does not need to duplicate this creation.

Figure 15:
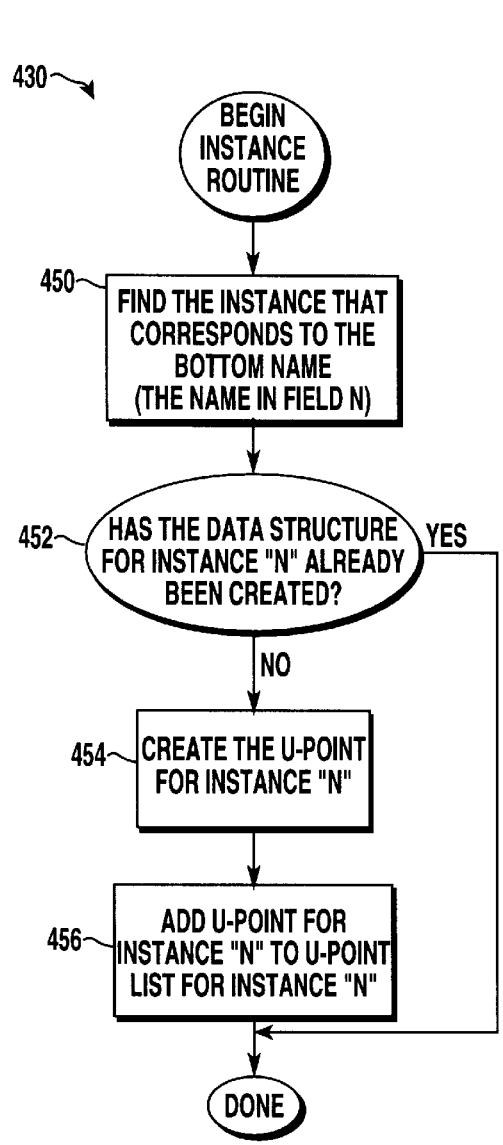
FIG. 15 is a flow chart illustrating a suitable method for performing the "instance" routine step 430 of FIG. 14 in accordance with one aspect of the present invention.

However, if the u-point data structure 235 for the given instance has not been created, then the method of FIG. 15 proceeds in a step 454 to create the u-point for the given instance. Step 454 (analogous to step 412 of FIG. 14) includes allocating space in memory and setting an h-point pointer 237 and an h-data structure pointer 239 to indirect to their respective data structures. According to the described embodiments of the present invention, the h-point data structure and the h-data structure are created prior to step 454. In these embodiments step 454 simply consists of storing previously defined pointer values into the u-point data structure 235. However, in other embodiments, the h-point data structure and h-data structure may not be created prior to step 454. Accordingly, for these embodiments, step 454 would include the additional sub-steps necessary to create the corresponding h-data structure and h-point data structure.

In any event, after the u-point data structure 235 is created (and, if necessary, the other data structures), a step 456 adds a pointer to the u-point data structure 235 into the u-point list 228 of the corresponding h-point data structure 220. Following step 456, the method of step 430 is complete and control is passed back to the calling client.

Figure 16:
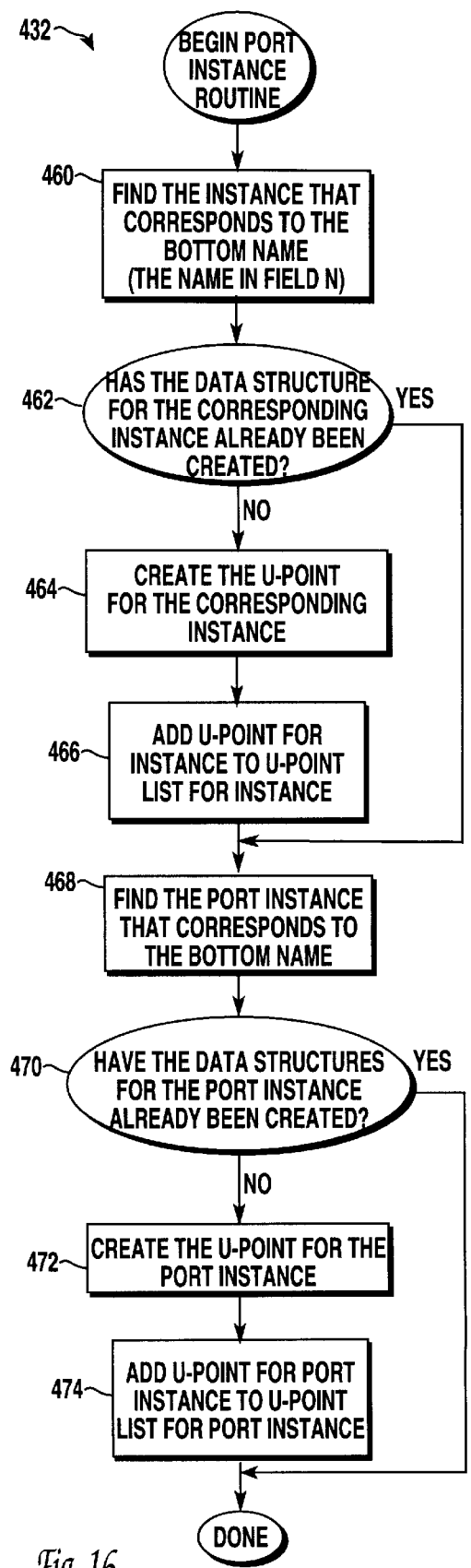
FIG. 16 is a flow chart illustrating a suitable method for performing the "port instance" routine step 432 of FIG. 14 in accordance with one aspect of the present invention.

Turning next to FIG. 16, one suitable method for performing "port instance" routine step 432 of FIG. 14 will be described. An initial step 460 finds the instance which contains the port instance of the element of field "N" (hereinafter termed the given instance). Thus the method of FIG. 16 utilizes two different elements, the instance of field "N-1" and the port instance of field "N." Then a step 462 determines if a u-point data structure 235 has been created for the given instance. In explanation, a previous request for this or a different element may have created the u-point data structure 235 for the given instance. If so, steps 464 and 466 are skipped as it unnecessary for step 432 to repeat this creation.

It should be noted that in conjunction with the embodiment described in FIG. 14, steps 460–466 are redundant and may thus be eliminated. However other embodiments are contemplated wherein these steps are necessary. In particular, step 406 of FIG. 14 may branch when i=N-1, thereby necessitating creation steps 460–466.

However, if the u-point data structure 235 for the given instance has not been created, then the method of FIG. 16 proceeds in a step 464 to create the u-point for the given instance. Step 464 (analogous to step 412 of FIG. 14) includes allocating space in memory and setting an h-point pointer 237 and an h-data structure pointer 239 to indirect to their respective data structures. According to the described embodiments of the present invention, the h-point data structure and the h-data structure are created prior to step 464. In these embodiments step 464 simply consists of storing previously defined pointer values into the u-point data structure 235. However, in other embodiments, the h-point data structure and h-data structure may not be created prior to step 464. Accordingly, step 464 must include the steps necessary to create the corresponding h-data structure and h-point data structure.

In either case, after the u-point data structure 235 for the given instance is created (and, if necessary, the other data structures), a step 466 adds a pointer to the u-point data structure 235 into the u-point list 228 of the corresponding h-point data structure 220.

A next step 468 finds the port instance which corresponds to the bottom name. Then a step 470 determines if a u-point data structure 235 has already been created for the port instance. In explanation, a previous request for this or a different element may have created the desired port instance u-point data structure 235. If so, step 432 is complete as it does not need to duplicate this creation.

However, if the port instance u-point data structure 235 for the given module has not been created, then the method proceeds in a step 472 to create the port instance u-point. Step 472 includes allocating space in memory and setting an h-point pointer 237 and an h-data structure pointer 239 to indirect to their respective data structures. According to the described embodiments of the present invention, the port instance's h-point data structure and h-data structure are created prior to step 472. In these embodiments step 472 simply consists of storing previously defined pointer values into the port instance u-point data structure 235. However, in other embodiments, the port instance's h-point data structure and h-data structure may not be created prior to step 472. Accordingly, in these embodiments, step 472 would include the steps necessary to create the corresponding h-data structure and h-point data structure.

In any event, after the port instance u-point data structure 235 is created (and, if necessary, the other data structures), a step 474 adds a pointer to the port instance u-point data structure 235 into the u-point list 228 of the corresponding h-point data structure 220. Following step 474, the described method of step 432 is complete and control is passed back to the requesting client.

With attention directed to FIG. 17, a method for performing step 434 of FIG. 14 in accordance with one aspect of the present invention will be described. An initial step 480 determines if the name has a prefix (or prefixes) other than the top level module. In other words, the question "Is N greater than two?" is posed. Recall that, by definition, ports may only occur in the top level module. Thus, if the port name has more than one prefix, an error has occurred. Accordingly, a step 481 aborts the process and returns an error message to the requesting client. Note that step 481 would supersede and abort the subsequent steps of methods such as method 400 of FIG. 14.

Figures 17, 18:
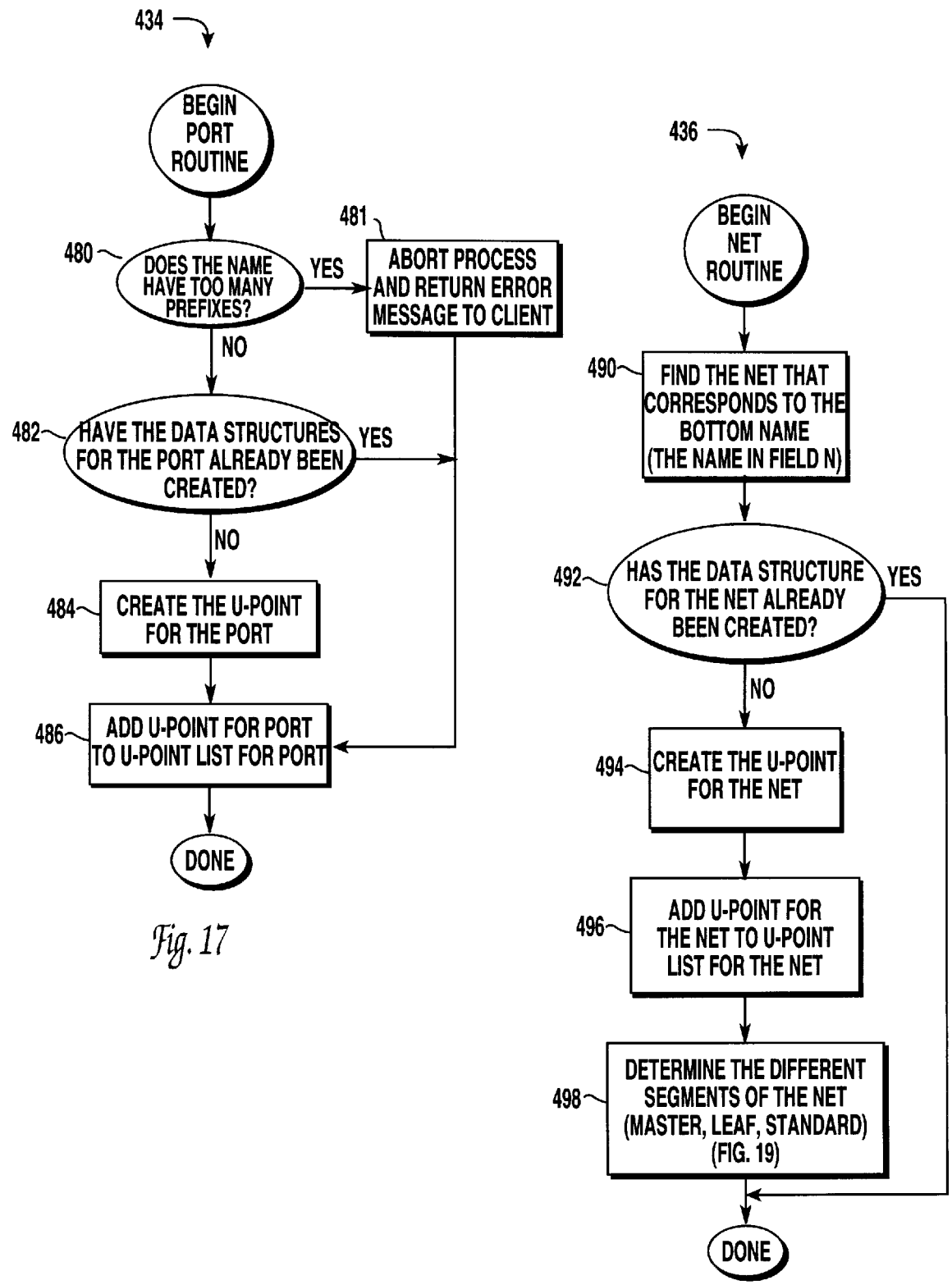
FIG. 17 is a flow chart illustrating a suitable method for performing the "port" routine step 434 of FIG. 14 in accordance with one aspect of the present invention.
FIG. 18 is a flow chart illustrating a suitable method for performing the "net" routine step 436 of FIG. 14 in accordance with one aspect of the present invention.

However, if no errors have occurred, the method of FIG. 17 continues in a step 482. Step 482 determines if a u-point data structure 235 has already been created for the port. As will be apparent, a previous request for this or a different element may have created the desired port u-point data structure 235. If so, step 434 is complete as it does not need to duplicate this creation.

However, if the port u-point data structure 235 has not been created, then the method proceeds in a step 484 to create the port u-point. Step 484 includes allocating space in memory and setting an h-point pointer 237 and an h-data structure pointer 239 to indirect to their respective data structures. After the port u-point data structure 235 is created (and, if necessary, the other data structures), a step 486 adds a pointer to the port u-point data structure 235 into the u-point list 228 of the corresponding h-point data structure 220. Note that steps 484 and 486 are analogous to previously described steps 472 and 474 of FIG. 16 (for example). Therefore, for a more detailed description of steps 484 and 486, please see the relevant portion of the discussion of FIG. 16. Following step 486, the described method of step 434 is complete and control is passed back to the calling client.

With reference to FIG. 18, a method for performing the "net" routine step 436 of FIG. 14 in accordance with one aspect of the present invention will be described. An initial step 490 will find the net that corresponds to the current net segment. As discussed previously with reference to FIGS. 9 and 10, a single net segment is typically one of a set of electrically equivalent net segments. A next step 492 determines if the data structures for the net have already been created and, if so, step 436 is complete and control is returned to the requesting client.

However, if the data structures have not been created, then a step 494 creates a u-point data structure 244 for the current net segment. As discussed previously with reference to FIGS. 15–17, if it is necessary at this point, the h-point data structure and h-data structure will be created. Step 494 includes allocating space in memory and setting an h-point pointer 246 and an h-data structure pointer 248 to indirect to their respective data structures. Additionally, the newly created u-point data structure 244 will include a null net segment type field 250 and a null leaves/master pointer 252. Appropriate data will be stored in these fields during the execution of a subsequent step 498 as described below.

After the net u-point data structure 244 is created (and, if necessary, the other data structures), a step 496 stores a pointer to the net u-point data structure 244 into the u-point list 228 of the corresponding h-point data structure 220. A next step 498 determines the different segments of the net, including master, leaf, and standard segments. Step 498 includes generating u-point data structures and properly initializing each field of the u-point data structures. A more detailed description of one suitable embodiment of step 498 is described below with reference to FIG. 19. After completing step 498, step 436 is complete and control is passed to the requesting client.

Figure 19:
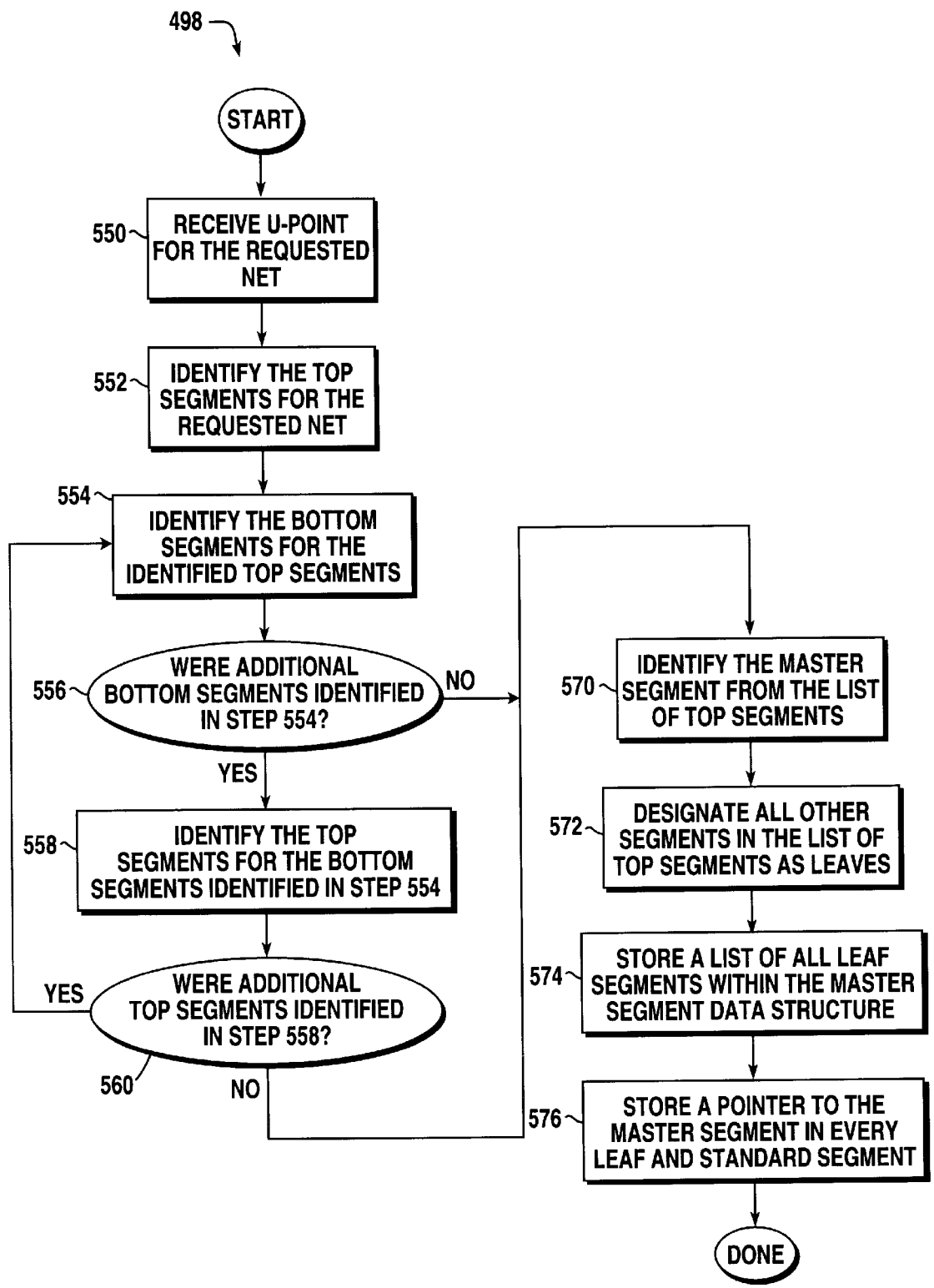
FIG. 19 is a flow chart illustrating a method for identifying and classifying the net segments of a net in accordance with another aspect of the present invention.

Turning next to FIG. 19, one method for performing step 498 of FIG. 18 will be described. An initial step 550 receives a u-point data structure 244 for one net segment of a net. Then, a step 552 identifies the top segments for the requested one net segment. A net segment's top segments are identified by traversing upward in the hierarchy towards the top level module identifying each equivalent net segment which (a) is contained in the top level module or (b) does not connect to a port of its module. Using net 512 of FIG. 10 for an example, a top net segment of net segment 517 (in this case the only top net segment) would be net segment 515. In addition to identifying the top net segments, step 552 will create any u-point and/or other necessary data structures.

Once all the top net segments have been identified in step 552, a step 554 identifies all the bottom net segments of the top segments identified in a previous step. In explanation, a "bottom net segment" is a net segment which does not connect to any instances that are not bottom level instances. As will be apparent in from the following description, top net segments may be identified in steps such as step 552 or step 558 which will be discussed below. Using net 512 of FIG. 10 for an example, the bottom net segment of net segment 515 is net segment 519. Once again, in addition to identifying the bottom net segments, step 554 will create any u-point and/or other necessary data structures.

A subsequent step 556 determines if any additional bottom segments were identified in step 554. If so, then a step 558 will identify the top segments for the bottom segments identified in step 554. Akin to step 552, step 558 will create any u-point and/or other necessary data structures. Referring again to the example of FIG. 10, the only new top segment which would be found in step 558 is net segment 521 which is a top net segment of net segment 519.

A next step 560 determines if additional top segments were identified in step 558. If additional top segments were identified in step 558, control loops back to bottom segment identification step 554. If no additional top segments were identified in step 558, then control proceeds from step 560 to a step 570. Additionally, if no bottom segments were identified in step 554, then control also proceeds from step 556 to step 570. It will be appreciated that the looping method executed by steps 552-560 guarantee that each segment of the net will be identified and the appropriate data structures generated. Of course other embodiments which identify and create data structures (when necessary) for each net segment of the net fall within the scope of the present invention.

In any event, after each net segment is identified, step 570 identifies the master segment from the list of top segments found and stores an appropriate identifier into the master segment's net segment type field 250. While it is possible for more than one net segment to have the characteristics necessary to be a master segment, it is not critical (for the purposes of the described embodiments) which net segment is chosen from these as the master segment. Recall from the description of FIGS. 9 and 10 that for a net segment to be a master segment, it must be a top segment, i.e.: the net segment is (a) contained in the top level module or (b) not connected to a port of its module. Generally an algorithm which selects the net segment at the highest level of hierarchy from within the top net segments is appropriate. However, rather than providing a technical advantage, this criterion is more for ease of the user, and is somewhat of an industry standard in netlist traversal utilities.

Once the master segment has been selected in step 570, a step 572 designates the remaining segments in the top segment list as leaf segments. Thus, all the remaining segments are then, by default, designated as standard segments.

Now that the type of each net segment has been determined, a step 574 stores a list of all leaf segments within the master segment u-point data structure's leaves/master pointer 252. Similarly, a step 576 stores a pointer to the master segment in the leaves/master pointer 252 for each leaf and standard segment. As will be appreciated, the order of steps 574 and 576 may be switched. In either case, the different segments of the net have been determined and defined and control is returned to step 436 of FIG. 18.

With reference to FIGS. 20–25, a few methods for further traversing a netlist, particularly a hierarchical netlist, will be described. As will be appreciated, obtaining the u-point for an element (as described above) may only be a first step in the desired traversal of the hierarchical netlist. More commonly, a netlist analysis tool will need to determine the elements connected to a known element. Therefore the present invention teaches this capability.

Figure 20:
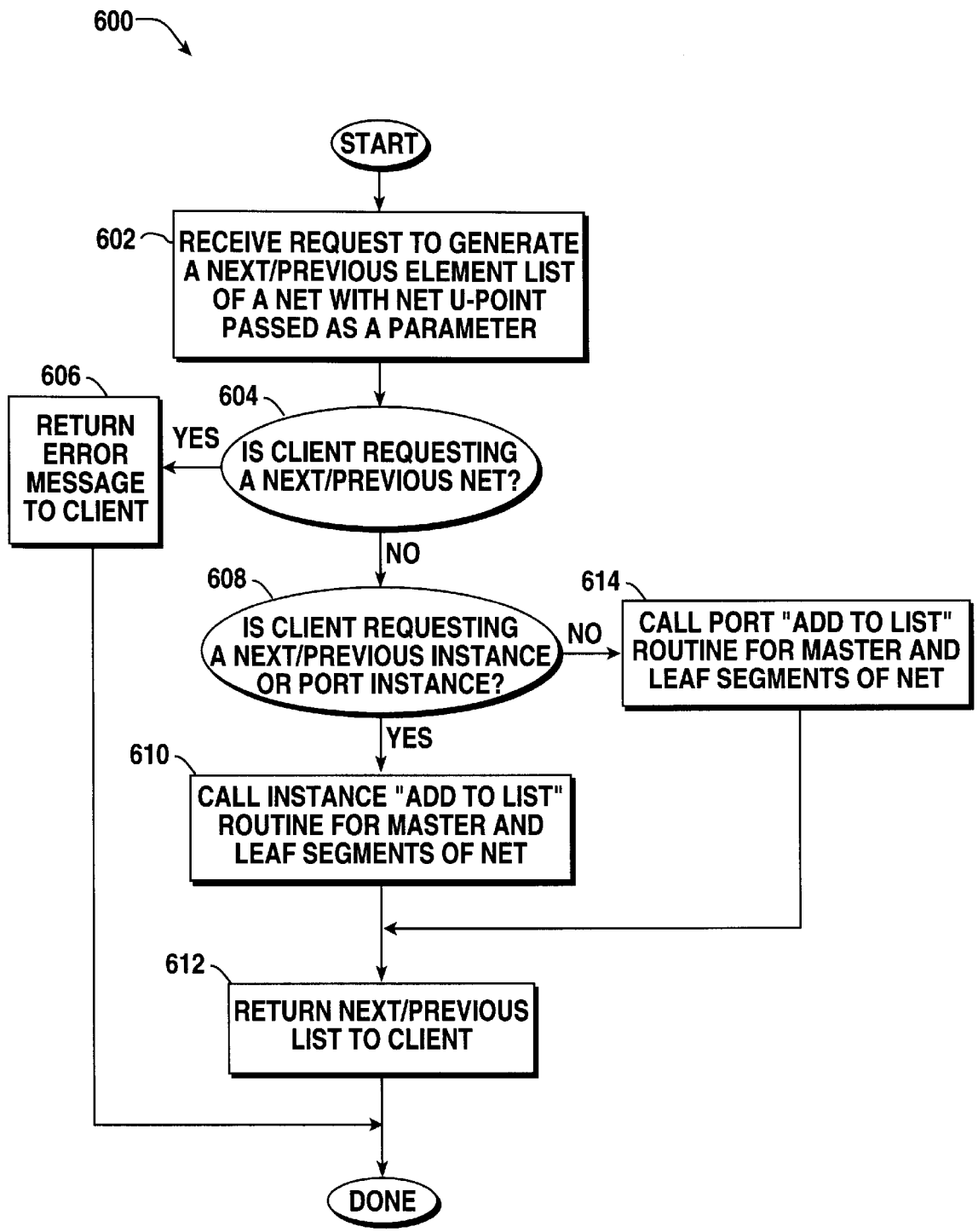
FIG. 20 is a flow chart illustrating a method for traversing a hierarchical netlist in accordance with one aspect of the present invention, the traversal generating a next/previous element list for a given net segment.

Turning directly to FIG. 20, a netlist traversal method 600 for generating a next/previous element list for a given net segment in accordance with one aspect of the present invention will be described. The method 600 begins as a step 602 receives a request to generate an element list for a given net. In the described embodiment of FIG. 20, the request includes the u-point data structure for the given net as well as specifying both the type of elements the list should contain and whether the desired element list should include all previous elements, all next elements, or a combination of the two. In the subsequent discussion, the term next/previous will be used to describe each possible list. When necessary, the description will be more particular in specifying the nature of the list.

After receiving the request, a step 604 determines if the client is requesting a next/previous element list of net segments. In the described embodiment, a request for a next/previous net is not supported. Thus, when a next/previous element list of net segments is requested, a step 606 returns an error message to the client and aborts the method 600. As is well familiar to those skilled in the art of netlist analysis, most E-CAD applications need to know explicitly about net segments and instances. Thus skipping from a net segment to a next/previous net segment or skipping from an instance to a next/previous instance is a capability which most likely would never be utilized. However, in light of the present detailed description, it will be apparent to those skilled in the art what the necessary steps are for generating such a list.

When the client is not requesting a next/previous net, a next step 608 determines if the client is requesting a next/previous instance or port instance list. If the list is for instances or port instances, a step 610 calls a routine "instance add to list" for each of the master and leaf segments of the net. Step 610 generates the appropriate next/previous element list. For a more detailed description of one suitable embodiment of step 610, please see the description of FIG. 21 below. After the list is generated, a step 612 returns the next/previous element list to the requesting client and method 600 is done.

Turning back to decision step 608, if the requested list is not for instances or port instances, then by default the requested list is for ports. Accordingly, a step 614 calls a routine "port add to list" for each of the master and leaf segments of the net. Step 614 will generate the appropriate next/previous element list. A more detailed description of one suitable embodiment of step 614 is provided below with reference to FIG. 22. After the list is generated, a step 612 returns the next/previous element list to the requesting client and method 600 is done.

Figures 21, 22:
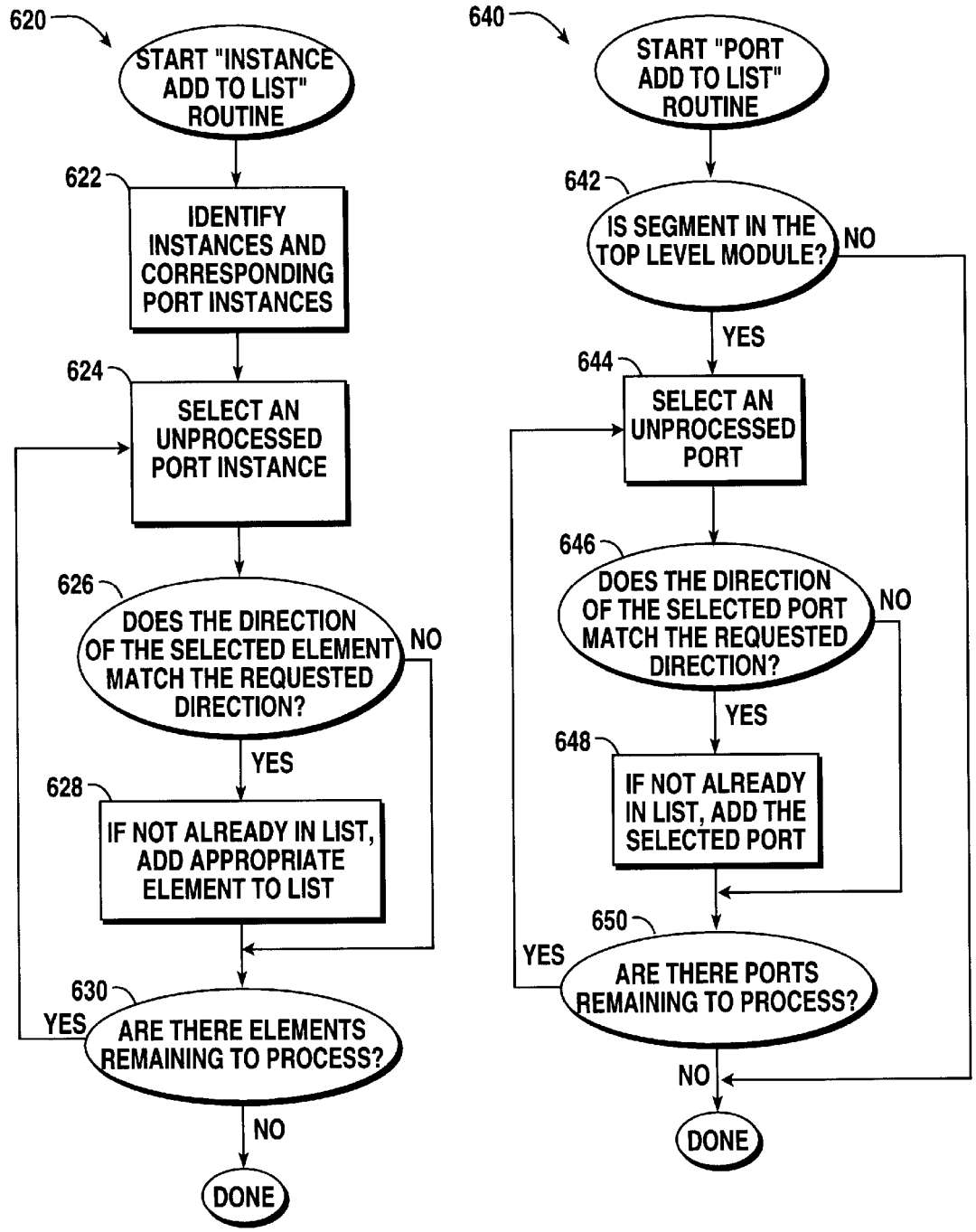
FIG. 21 is a flow chart illustrating one suitable method for performing the "instance add to list" routine step 610 of FIG. 20.
FIG. 22 is a flow chart illustrating one suitable method for performing the "port add to list" routine step 614 of FIG. 20.

With reference to FIG. 21, one method 620 for generating a next/previous instance or port instance list for a net will be described. The method 620 begins by receiving a net u-point data structure and a list specification (next, previous, or combination). A step 622 identifies each of the bottom level instances connected to the net by tracing downward in the hierarchy from the current master or leaf net segment and through the corresponding port instance. Then a step 624 selects an unprocessed instance and a corresponding port instance.

By definition, an unprocessed element is an element which has not been evaluated to determine if it belongs in the next/previous element list. A next step 626 determines if the direction of the corresponding port instance (port instances have directions, instances don't, therefore, evaluate the appropriate port instance) matches the requirements of the next/previous element. For example, if (i) the selected port instance is an input port instance and (ii) the list is a next element list, then the direction of the selected port instance matches the requirements of the next/previous element. However, when (i) the selected port instance is an input port instance and (ii) the list is a previous element list, then the direction of the selected port instance does not match the requirements of the next/previous element.

When the direction matches, a next step 628 adds, if not already in the list, the appropriate element. In explanation, if the list is an instance list, then the instance connected to the port instance is added to the list. In either case, a next step 630 determines if there are any remaining unprocessed elements and, if so, control loops back to selection step 624. However, if there are no remaining unprocessed elements, the complete next/previous element list is generated and method 620 is finished.

Focusing attention on FIG. 22, a method 640 for generating a next/previous port list for a net in accordance with another aspect of the present invention will now be described. The method 640 begins by receiving a segment u-point data structure and a list specification (next, previous, or combination). A next step 642 determines whether the segment is in the top level module. As will be apparent, if the segment is not in the top level module, then by the definition of a port, the segments next/previous port list will be empty. However, if the segment is in the top level module, then a step 644 selects an unprocessed port. By definition, an unprocessed port is a port which has not been evaluated to determine if it belongs in the next/previous element list. Of course, there may be no unprocessed ports, in which case the method 640 is complete.

Now that an unprocessed port has been selected, a step 646 determines if the direction of the selected port matches the selected direction. If the direction matches, a step 648 adds the selected port to the list when the port is not already in the list. Subsequent to step 648 or the NO branch of step 646, a step 650 determines if there are ports remaining to process. If ports remain unprocessed, control loops back to selection step 644. However, if there are no remaining unprocessed ports, the desired next/previous element list is fully generated and method 640 is done.

Figure 23:
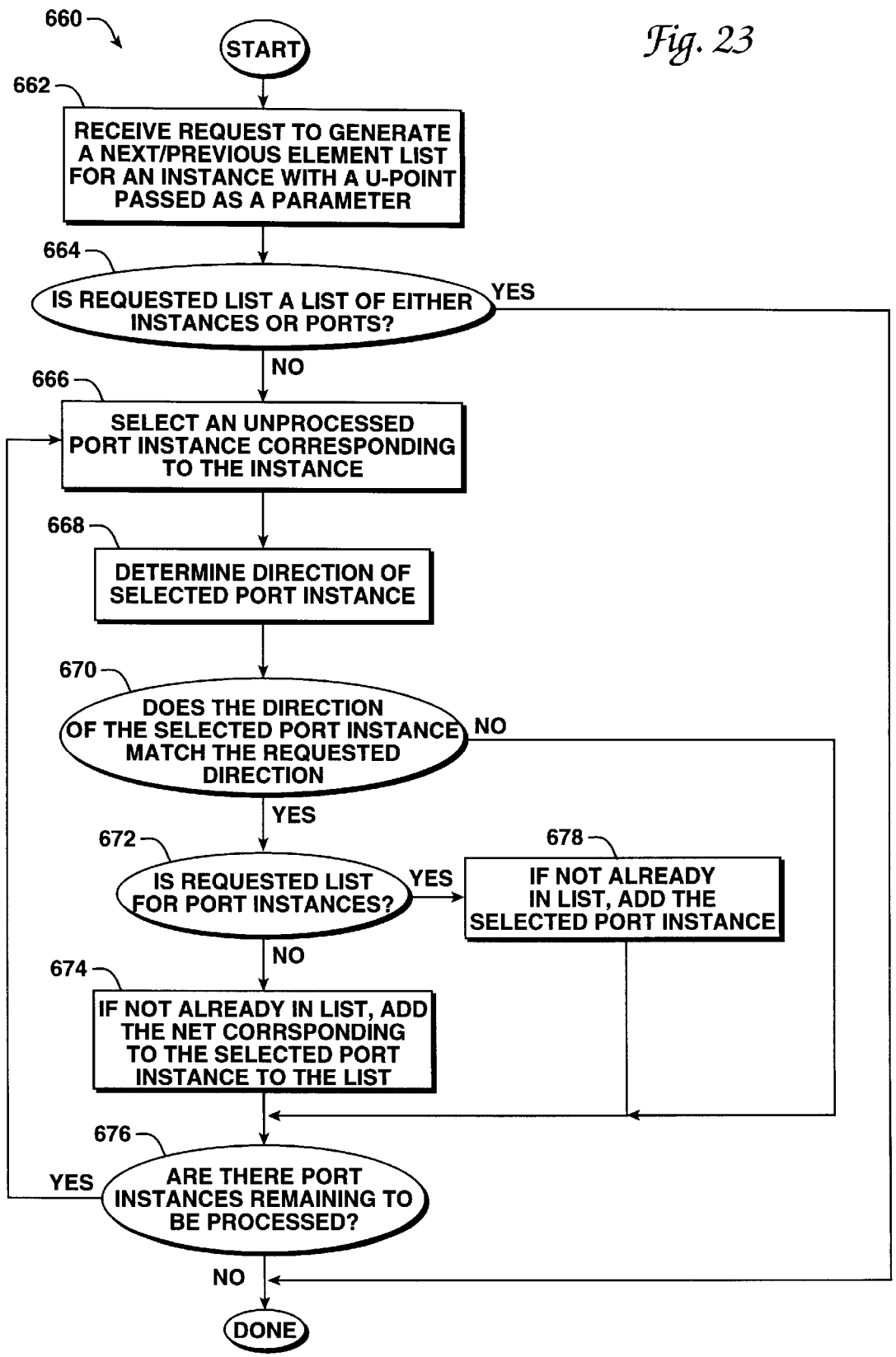
FIG. 23 is a flow chart illustrating a method for traversing a hierarchical netlist in accordance with yet another aspect of the present invention, the traversal generating a next/previous element list for a given instance.

With reference to FIG. 23, a netlist traversal method 660 for generating a next/previous element list for an instance in accordance with a further aspect of the present invention will be described. The method 660 begins as a step 662 receives a request to generate a next/previous element list for an instance. Parameters required in the request include a u-point data structure (or a pointer to the u-point data structure) for the present instance, a specification of the direction: next, previous, or a combination, and specification of the type of elements the list should contain.

After receiving the request, a step 664 determines if the list requested is either for instances or ports. In the embodiment of FIG. 23, a list of instances or ports is not supported. Accordingly, a step 665 will return an error message to the requesting client and abort the method 660. As described in more detail above with reference to step 606 of FIG. 20, the capability to skip from an instance to next/previous instances is a capability which would most likely never be used. Hence the described method 660 provides for only net and port instance lists.

A next step 666 selects an unprocessed port instance corresponding to the present instance. However, if there are no remaining unprocessed elements, the desired next/previous element list is generated and method 620 is done. Note that any given instance will typically have at least one corresponding output port instance. If it didn't, the given module could not interface with the hierarchical netlist. A couple of examples of instances with no inputs are simply hardwired 1's or 0's. However, if there are no port instances at all, this message could be returned to the requesting client.

Once a port instance has been selected, a step 668 determines the direction of the selected port instance. By definition, the port direction may be "input" (corresponding to a previous port instance), "output" (corresponding to a next port instance), or "bi-directional." In explanation, input or output is defined with respect to the instance. So, while an input port instance is a next element to a net, it is a previous element to an instance.

After the direction of the port instance has been established, a step 670 determines if the direction of the selected port matches the direction for the requested list.

When the direction matches, a step 672 determines whether the requested list is for port instances. If so, a step 678 will, if necessary, add the selected port instance to the list. If the requested list is not for port instances, then, by default, it is for nets. In this case, a step 674 will add the net corresponding to the selected port instance to the list. However, if the net is already in the list, it is not duplicated. After adding the appropriate element to the list, a step 676 determines if there are any port instances remaining to be processed, looping back to selection step 666 if so. If all the port instances have been processed, the list is returned to the requesting client and method 660 is done.

Figure 24:
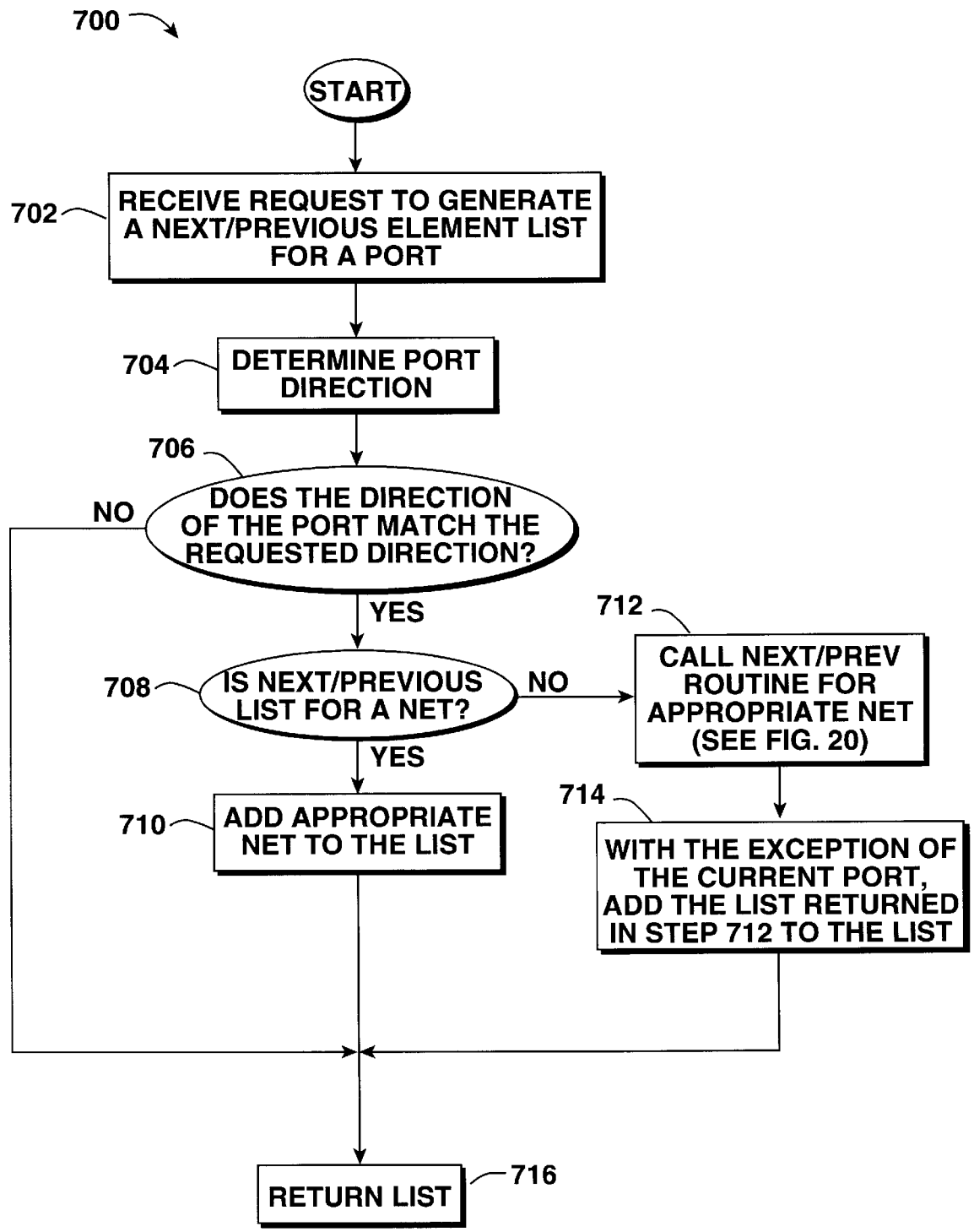
FIG. 24 is a flow chart illustrating still another method for traversing a hierarchical netlist in accordance with one other aspect of the present invention, the traversal generating a next/previous element list for a given port.

With reference to FIG. 24, a network traversal method 700 for generating a next/previous element list for a port in accordance with one aspect of the present invention is described. The method 700 begins as step 702 receives a request to generate a next/previous element list for a port. Then a step 704 determines the direction of the port, either input, output, or bi-directional. Once the port direction is determined, a step 706 determines whether the direction of the port matches the requested direction. Specifically, input corresponds to a next or a combination next/previous list, output corresponds to a previous or a combination next/previous list, and bi-directional corresponds to all directions. If the direction does not match, control proceeds directly to a step 716 which returns the list to the requesting client. In the case where the direction does not match, the returned list is empty.

However, if the direction of the port matches, a next step 708 determines if the next/previous element list is for a net segment. Note that the port may only be connected to a single net segment, thus a step 710 adds the single net segment to the list and then proceeds to step 716 where the list is returned to the client. When the next/previous element routine is not for a net, a step 712 calls a routine "generate next/previous element list" for the single net segment to which the port is attached. The next/previous direction and the element type (port, port instance, instance) requested would be the same as received in step 702. Step 712 then returns a list of elements (or possibly an error message). A next step 714 then generates the requested list from the list returned in step 712 by simply removing the current port from the list, if it is present. Then control is passed to step 716 which returns the element list to the requesting client.

Figure 25:
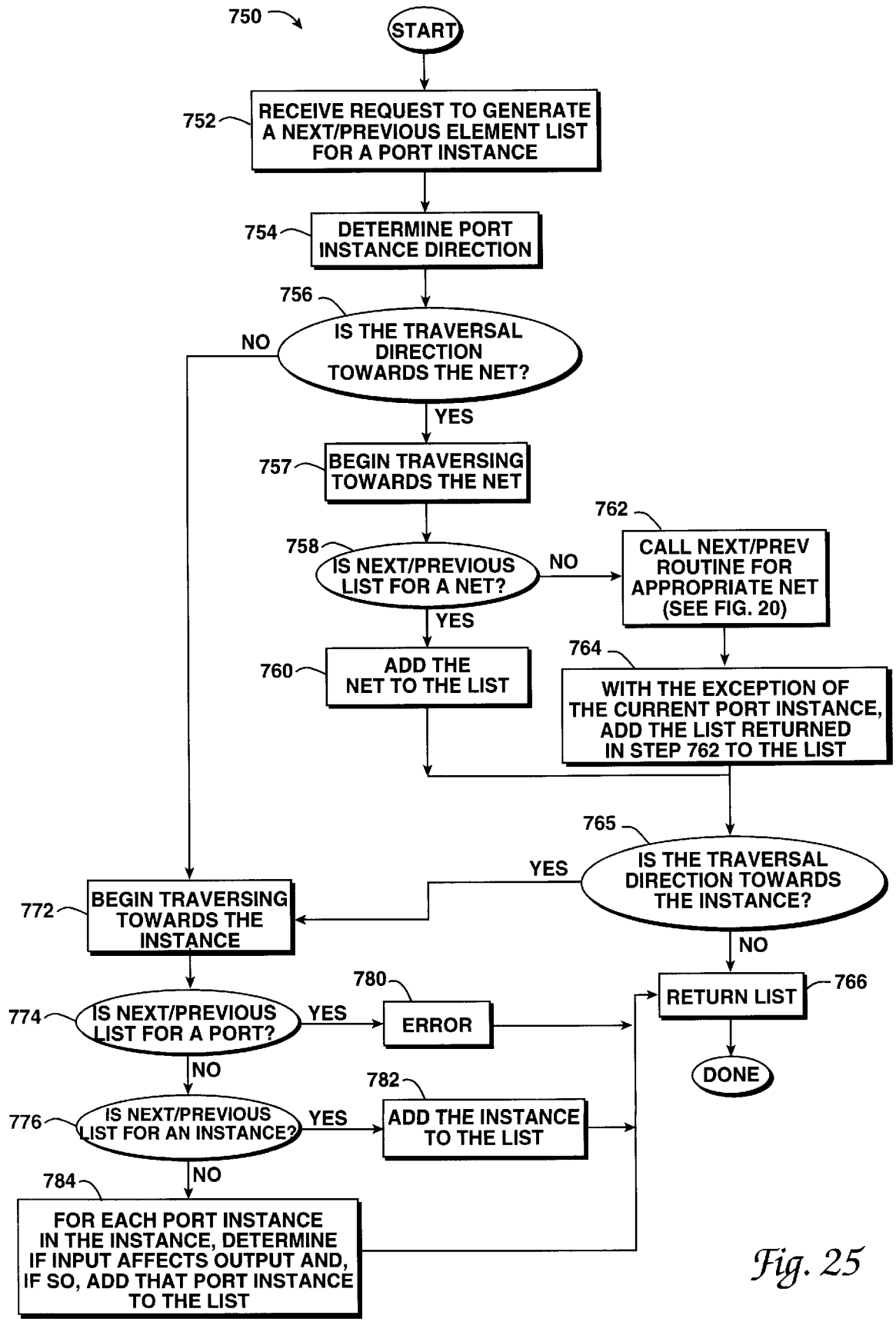
FIG. 25 is a flow chart illustrating another method for traversing a hierarchical netlist in accordance with one other aspect of the present invention, the traversal generating a next/previous element list for a given port instance.

With reference to FIG. 25, a network traversal method 750 for generating a next/previous element list for a port instance in accordance with one aspect of the present invention is described. The method 750 begins as step 752 receives a request to generate a next/previous element list for a port instance. Then a step 754 determines the direction of the port instance, either input, output, or bi-directional. Note that the direction of the port instance is distinct from the requested hierarchy direction (next/previous) which is provided in step 752. These two "directions" are subsequently used to determine a "traversal direction" which is defined for the method of FIG. 25 as either towards the net, towards the instance, or towards both. A next step 756 determines if the traversal direction is towards the net. If the traversal direction is not toward the net, then the traversal direction is toward the instance to which the port instance is attached.

The possible variations which determine the traversal direction can be enumerated as follows. If (a) the port instance is an input and the requested direction is previous or if (b) the port instance is an output and the requested direction is next, then the traversal direction is towards the net. If (a) the port instance is an output and the requested direction is previous or (b) the port instance is an input and the requested direction is next, then the traversal direction is towards the instance. Additionally, if the port instance is bi-directional and/or if the requested direction is both previous and next, then the client's request is to traverse both towards the net and the instance.

If the traversal direction is towards the net, a step 757 marks the beginning of traversal towards the net and then a next step 758 determines if the next/previous element list is for a net segment. Note that the port instance is only connected to a single net segment, thus a step 760 adds the single net segment to the list and then proceeds to step 765. When the next/previous element routine is not for a net, a step 762 calls a routine "generate next/previous element list" for the single net segment to which the port is attached. The next/previous direction and the element type (port, port instance, instance) requested would be the same as received in step 752. Step 762 then returns a list of elements (or possibly an error message). A next step 764 then generates the requested list from the list returned in step 762 by simply removing the current port instance from the list, if it is present.

After a list has been generated in either of steps 760 or 764, a step 765 determines if the traversal direction is also towards the instance. If so, control is passed to a step 772 which marks the beginning of traversal in the direction of the instance. Otherwise, control is passed to step 766 which returns the element list to the requesting client.

Turning back to step 756, if the traversal direction is towards the instance, control is passed to a step 772 which marks the beginning of traversal in the direction of the instance and then a step 774 determines if the next/previous element list is for element type port. If so, an error message is returned in step 780 (as an instance cannot have a port) and in step 766 the list, if one has been generated, is returned to the requesting client. Otherwise, a step 776 determines if the next/previous list is for an instance.

When the next previous list is for an instance, a step 782 adds the appropriate instance (the instance corresponding to the current port instance) to the list and control is passed to step 766 which returns the list to the requesting client. However, if the next previous list is determined to be not for an instance in step 776, then a step 784 is performed. Step 784 evaluates the relation between the current port instance and each separate port instance of the associated instance. Thus some number of pairs of port instances are evaluated, each pair consisting of the current port instance and a separate port instance. Looping through each of these pairs, if one of the pair effects the other, then the separate instance is added to the list. Then, the completed list is returned to the client in step 766.

Although only a few embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A hierarchical netlist stored in a computer readable medium, the hierarchical netlist being arranged to represent an electronic device having a multiplicity of device elements, the hierarchical netlist representing the electronic device through hierarchical elements, each hierarchical element corresponding to one or more unique occurrences of separate but identical device elements, the hierarchical element types including a) port, b) port instance, c) net segment, and d) instance, wherein hierarchical elements of type instance include instantiations of gates that correspond to associated device elements, and instantiations of modules that each correspond to an associated logic block of device elements represented as a plurality of hierarchical elements, the hierarchical netlist including:

a module data structure including a first module and a list identifying each instance of the first module present in the hierarchical netlist; and a hierarchical point data structure that represents a first hierarchical element in the hierarchical netlist, the first hierarchical point data structure being arranged to identify a selected device element represented in the first module, the hierarchical point data structure being capable of identifying a plurality of unique occurrences of separate but identical device elements that are represented by the first hierarchical element, the hierarchical point data structure including:

a type field for indicating the type of the first hierarchical element;

a parent module pointer field for indirecting to the first hierarchical element's parent module;

an element pointer field for indirecting to the first hierarchical element in the hierarchical netlist;

a unique point list for use in identifying the plurality of unique occurrences; and a bottom level flag for indicating whether the first hierarchical element is at a bottom of a traversable hierarchy of the hierarchical netlist.

2. A hierarchical netlist as recited in claim 1 further including a unique point data structure representing the selected device element, the unique point data structure including a hierarchical point data structure pointer for indirecting to the hierarchical point data structure.

3. A hierarchical netlist as recited in claim 2 wherein when the hierarchical element is a net segment, the unique point data structure further includes:

a net segment type field for indicating whether the net segment is a master, leaf, or standard net segment; and a leaves/master pointer field.

4. A hierarchical netlist as recited in claim 3 wherein when the net segment is a master net segment of a net, the leaves/master pointer field includes a list of pointers to each leaf net segment of the net.

5. A hierarchical netlist as recited in claim 3 wherein when the net segment is a leaf net segment or a standard segment of a net, the leaves/master pointer field includes a pointer to a master net segment of the net.

6. A hierarchical netlist as recited in claim 2 wherein the unique point list includes a pointer to the unique point data structure.

7. A hierarchical netlist as recited in claim 1 wherein the selected device element has an associated element name that is defined according to a hierarchically nested naming convention such that the element name is arranged to define a top level module and, as required to hierarchically specify the identified occurrence within the hierarchical netlist, a subsequent plurality of nested instances.

8. A hierarchical netlist as recited in claim 7 wherein the element name is a character string made up of an integer number of delimiter separated substrings, a first one of the substrings representing the top level module, a last one of the substrings representing the selected element, and each intermediate substring representing an associated one of the subsequent plurality of the nested instances which take the form of nested modules.

9. A computer system comprising:

a central processing unit;

a memory accessible by the central processing unit; and a hierarchical netlist as recited in claim 1 resident in the memory.

10. A hierarchical netlist stored in a computer readable medium, the hierarchical netlist being arranged to represent an electronic device having a multiplicity of device elements, the hierarchical netlist representing the electronic device through hierarchical elements, each hierarchical element corresponding to one or more unique occurrences of separate but identical device elements, the hierarchical element types including a) port, b) port instance, c) net segment, and d instance, wherein hierarchical elements of type instance include instantiations of gates that correspond to associated device elements, and instantiations of modules that each correspond to an associated logic block of device elements represented as a plurality of hierarchical elements, the hierarchical netlist including:

a module data structure including a first module and a list identifying each instance of the first module present in the hierarchical netlist;

a hierarchical point data structure that represents a first hierarchical element in the hierarchical netlist, the first hierarchical point data structure being arranged to identify a selected device element represented in the first module, the hierarchical point data structure being capable of identifying a plurality of unique occurrences of separate but identical device elements that are represented by the first hierarchical element; and a unique point data structure representing the identified occurrence, the unique point data structure including a hierarchical point data structure pointer for indirecting to the hierarchical point data structure, wherein when the hierarchical element is a net segment, the unique point data structure further includes a net segment type field for indicating whether the net segment is a master, leaf, or standard net segment, and a leaves/master pointer field.

11. A hierarchical netlist as recited in claim 10 wherein when the net segment is a master net segment of a net, the leaves/master pointer field includes a list of pointers to each leaf net segment of the net.

12. A hierarchical netlist as recited in claim 10 wherein when the net segment is either a leaf net segment or a standard net segment of a net, the leaves/master pointer field includes a pointer to a master net segment of the net.

13. A computer implemented method for initializing a hierarchical netlist in preparation for traversal, the hierarchical netlist being arranged to represent an electronic device having a multiplicity of device elements, the hierarchical netlist representing the electronic device through hierarchical elements, each hierarchical element corresponding to one or more unique occurrences of separate but identical device elements, the hierarchical element types including a) port, b) port instance, c) net segment and d) instance, wherein hierarchical elements of type instance include instantiations of gates that correspond to associated device elements, and instantiations of modules that each correspond to an associated logic block of device elements represented as a plurality of hierarchical elements, the method comprising the computer controlled steps of:

providing the hierarchical netlist arranged such that when one or more unique occurrences of separate but identical device elements exist in the electronic device, the hierarchical netlist maintains only a single definitive representation of the device elements; and generating a single hierarchical point data structure for each hierarchical element in the hierarchical netlist, wherein a given hierarchical element is determined to be at the bottom of the traversable hierarchy of the hierarchical netlist if the element type of the given hierarchical element is instance and the given hierarchical element contains no hierarchical elements.

14. A computer implemented method as recited in claim 13 wherein the step of generating a single hierarchical point data structure for each hierarchical element in the hierarchical netlist includes the substeps of:

(a) selecting an unprocessed hierarchical element from the hierarchical netlist, wherein any hierarchical element for which an associated hierarchical point data structure has not been generated is defined as unprocessed, the selected hierarchical element being associated with a first single definitive representation of a first device element;

(b) allocating memory for a hierarchical point data structure associated with the selected hierarchical element, the hierarchical point data structure including a type field, a parent module pointer field, an element pointer field, a unique point list, and a bottom level flag;

(c) storing a type identifier identifying an element type of the selected hierarchical element in the type field, the element type chosen from the group including port, port instance, instance and net segment;

(d) storing a pointer to a parent module of the selected hierarchical element in the parent module pointer field;

(f) storing a pointer to the first single definitive representation within the element pointer field;

(g) creating a null list within the unique point list, the unique point list capable to identify a plurality of unique occurrences of a plurality of separate but identical first device elements;

(h) setting the bottom level flag when the hierarchical element is at the bottom of the traversable hierarchy of the hierarchical netlist; and (i) repeating steps (a)–(h) until all hierarchical elements within the hierarchical netlist have been processed.

15. A computer implemented method for initializing a hierarchical netlist in preparation for traversal, the hierarchical netlist being arranged to represent an electronic device having a multiplicity of device elements, the hierarchical netlist representing the electronic device through hierarchical elements, each hierarchical element corresponding to one or more unique occurrences of separate but identical device elements, the hierarchical element types including a) port, b) port instance, c) net segment and d) instance, wherein hierarchical elements of type instance include instantiations of gates that correspond to associated device elements, and instantiations of modules that each correspond to an associated logic block of device elements represented as a plurality of hierarchical elements, the method comprising the computer controlled steps of:

providing the hierarchical netlist arranged such that when one or more unique occurrences of separate but identical device elements exist in the electronic device, the hierarchical netlist maintains only a single definitive representation of the device elements; and generating a single hierarchical point data structure for each hierarchical element in the hierarchical netlist, the generating including the substeps of:

(a) selecting an unprocessed hierarchical element from the hierarchical netlist, wherein any hierarchical element for which an associated hierarchical point data structure has not been generated is defined as unprocessed, the selected hierarchical element being associated with a first single definitive representation of a first device element;

(b) allocating memory for a hierarchical point data structure associated with the selected hierarchical element, the hierarchical point data structure including a type field, a parent module pointer field, an element pointer field, a unique point list, and a bottom level flag;

(c) storing a type identifier identifying an element type of the selected hierarchical element in the type field, the element type chosen from the group including port, port instance, instance and net segment;

(d) storing a pointer to a parent module of the selected hierarchical element in the parent module pointer field;

(f) storing a pointer to the first single definitive representation within the element pointer field;

(g) creating a null list within the unique point list, the unique point list capable to identify a plurality of unique occurrences of a plurality of separate but identical first device elements;

(h) setting the bottom level flag when the hierarchical element is at the bottom of the traversable hierarchy of the hierarchical netlist, the selected hierarchical element determined to be at the bottom of the traversable hierarchy of the hierarchical netlist if the selected hierarchical element is listed on a client provided stoplist; and (i) repeating steps (a)–(h) until all hierarchical elements within the hierarchical netlist have been processed.

16. A method as recited in claim 15 wherein the selected hierarchical element is determined to be at the bottom of the traversable hierarchy of the hierarchical netlist if the element type of the selected hierarchical element is instance and the selected hierarchical element contains no hierarchical elements.

17. A computer implemented method of traversing a netlist that is arranged to represent an electronic device having a multiplicity of device elements, the method comprising the computer controlled steps of:

providing the hierarchical netlist arranged such that when one or more unique occurrences of separate but identical device elements exist in the electronic device, the hierarchical netlist maintains only a single definitive representation of the device elements;

receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element; and storing a pointer to the first unique point data structure in the first hierarchical point data structure;

wherein the identifier for the first unique device element is a string arranged to hierarchically specify the first unique device element within the hierarchical netlist by identifying the first unique device element and all module levels required to specify and uniquely define the first unique device element, wherein the step of creating the first unique point data structure for the first unique device element includes the substeps of:
(a) for each module level, creating a corresponding unique point data structure if such corresponding unique point data structure does not already exist; and
(b) for each module level, storing a pointer to the corresponding unique point data structure in the corresponding hierarchical point data structure if such pointer does not already exist.

18. A computer implemented method as recited in claim 17 wherein the hierarchical point data structure is created before the identifier is received.

19. A computer implemented method as recited in claim 17 wherein the identifier is a character string made up of an integer number of delimiter separated substrings, a first one of the substrings representing a top level module, a last one of the substrings representing the first unique device element, and each intermediate substring representing an associated nested one of the hierarchical levels, the method further including the computer controlled step of parsing the identifier into different fields based upon the delimiter.

20. A computer implemented method of traversing a netlist that is arranged to represent an electronic device having a multiplicity of device elements, the method comprising the computer controlled steps of:
providing the hierarchical netlist arranged such that when one or more unique occurrences of separate but identical device elements exist in the electronic device, the hierarchical netlist maintains only a single definitive representation of the device elements;
receiving an identifier indicative of a selected first unique device element in the electronic device, the selected first unique device element being associated with a first single definitive representation of the selected first device element;
creating a first hierarchical point data structure that corresponds to the selected first unique device element;
creating a first unique point data structure that corresponds to the first unique device element; and
storing a pointer to the first unique point data structure in the first hierarchical point data structure;
wherein the first unique device element is a first net segment of a net, the net including a set of electrically equivalent net segments that includes the first net segment, wherein the method further comprises the computer controlled steps of:
identifying each equivalent net segment of the net;
for each identified net segment, creating a unique point data structures corresponding to the identified net segment if such corresponding unique point data structure does not already exist;
identifying a master net segment for the net, the master net segment being selected from the set of equivalent net segments, wherein the unique point data structure corresponding to the identified master net segment is defined as the master net segment unique point data structure;
identifying any leaf net segments for the net that exist within the set of equivalent net segments;
identifying any standard net segments for the net that exist within the set of equivalent net segments;
storing a list of all identified leaf net segments within the master net segment unique point data structure; and for each identified leaf net segment and each identified standard net segment, storing a pointer to the master net segment unique point data structure within the corresponding unique point data structures.

21. A computer implemented method as recited in claim 20 further comprising the steps of creating a top net segment list and a standard net segment list, and for each of the equivalent net segments:
determining whether the equivalent net segment is a top net segment, and if so, adding an identification of that equivalent net segment to the top net segment list, wherein a top net segment is defined as a net segment that is either in the top level module or does not connect to a port in its module;
if the equivalent net segment is not a top net segment, adding an identification of that equivalent net segment to the standard net segment list; and
determining if the equivalent net segment is a bottom net segment.

22. A computer implemented method as recited in claim 21 wherein the top net segment and bottom net segment determining steps are part of the equivalent net segment identifying step and are accomplished by:
(i) identifying all top net segments associated with the first net segment and adding all identified top net segments to the top net segment list;
(ii) for each newly identified top net segment, identifying each net segment associated with such newly identified top net segment and adding the newly identified net segments to the standard net segment list;
(iii) for each newly identified top net segment, identifying each bottom net segment associated with such newly identified top net segment, wherein bottom net segments are defined as net segments which do not connect to any instances that are not bottom level instances;
(iv) for each newly identified bottom net segment, identifying each top net segment associated with such newly identified bottom net segment and adding any newly identified top net segments to the top net segment list; and
(v) repeating steps (ii)–(iv) until no new net segments are identified.

23. A computer implemented method as recited in claim 21 wherein the step of identifying the master net segment for the net includes the substeps of:
(i) identifying from the top net segment list each top net segment which is in a highest level of hierarchy in which the net appears; and
(ii) selecting the master net segment from all top net segments identified in step (i).

24. A computer implemented method as recited in claim 23 wherein the step of identifying the leaf net segments includes identifying each top net segment which is not the master segment as a leaf net segment.

25. A computer implemented method of traversing a netlist that is arranged to represent an electronic device having a multiplicity of device elements, the method comprising the computer controlled steps of:
providing the hierarchical netlist arranged such that when one or more unique occurrences of separate but identical device elements exist in the electronic device, the hierarchical netlist maintains only a single definitive representation of the device elements;
receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element; and storing a pointer to the first unique point data structure in the first hierarchical point data structure;

wherein when the selected first unique device element is a net segment, the method further comprises the steps of:

receiving a request from a client to generate an element list for the net segment, the element list for the net segment being a type chosen from the group including port, port instance, net, and instance, a traversal direction for the element list being chosen from the group consisting of next elements, previous elements, and a combination of next and previous elements;

generating the requested element list for the net segment; and returning the requested element list for the net segment to the client.

26. A computer implemented method as recited in claim 25 wherein when the requested element list is a port list then the step of generating the requested element list for the net segment includes the substeps of:

determining if the net segment is in a top level module; and if the net segment is not in the top level module, generating an empty element list for returning to the requesting client.

27. A computer implemented method as recited in claim 26 wherein when the net segment is in the top level module then the step of generating the requested element list for the net segment further includes the substeps of:

(a) selecting an unprocessed port if any unprocessed ports are available;

(b) determining whether the direction of the selected port matches the requested direction;

(c) when the direction of the selected port matches the requested direction and the selected port is not already in the port list, adding the selected port to the port list;

(d) marking the selected port as processed; and (e) repeating steps (a)–(d) until all ports have been marked as processed.

28. A computer implemented method as recited in claim 25 wherein when a type of the requested element list is either instance or port instance, the step of generating the requested element list for the net segment includes the substeps of:

(a) identifying bottom instances and corresponding port instances for the net segment;

(b) selecting an unprocessed port instance if any unprocessed port instances are available;

(c) determining whether the direction of the selected port instance matches the requested direction;

(d) when the direction of the selected port instance matches the requested direction, performing a one of the following substeps of:

(i) when the element list is a port instance list and the selected port instance is not in the port instance list, adding the selected port instance to the port instance list; or (ii) when the element list is an instance list and an instance corresponding to the selected port instance is not in the instance list, adding the instance to the instance list;

(e) marking the selected port instance as processed; and (f) repeating steps (b)–(e) until all identified port instances have been marked as processed.

29. A computer implemented method as recited in claim 26 wherein when (a) the direction of the port matches the requested direction and (b) the type of the requested element list is net segment, the step of generating the requested element list for the port further includes the substep of adding any net segments electrically coupled to the port and present in a top module to the net segment list.

30. A computer implemented method of traversing a netlist that is arranged to represent an electronic device having a multiplicity of device elements, the method comprising the computer controlled steps of:

providing the hierarchical netlist arranged such that when one or more unique occurrences of separate but identical device elements exist in the electronic device, the hierarchical netlist maintains only a single definitive representation of the device elements;

receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element; and storing a pointer to the first unique point data structure in the first hierarchical point data structure, wherein when the selected first unique device element is an instance, the method further comprises the steps of:

receiving a request from a client to generate an element list for the instance, a type of the element list being chosen from the group including port, port instance, net segment, and instance, a traversal direction for the element list being chosen from the group consisting of next elements, previous elements, and a combination of next and previous elements;

generating the requested element list for the instance; and returning the requested element list to the client.

31. A computer implemented method as recited in claim 30 wherein when the type of the requested element list is either net segment or port instance, the step of generating the requested element list for the instance includes the substeps of:

(a) selecting an unprocessed port instance corresponding to the instance, if any unprocessed port instances are available;

(b) determining whether a direction of the selected port instance matches the requested direction;

(c) when the direction of the selected port instance matches the requested direction, performing one of the following substeps of:

(i) when the element list is a net segment list and the net segment corresponding to the selected port instance is not in the net segment list, adding the net segment to the net segment list; or (ii) when the element list is a port instance list and the selected port instance is not in the port instance list, adding the selected port instance to the port instance list;

(d) marking the selected port instance list as processed; and (e) repeating steps (a)–(d) until all port instances corresponding to the instance are marked as processed.

32. A computer implemented method of traversing a netlist that is arranged to represent an electronic device having a multiplicity of device elements, the method comprising the computer controlled steps of:

providing the hierarchical netlist arranged such that when one or more unique occurrences of separate but identical device elements exist in the electronic device, the hierarchical netlist maintains only a single definitive representation of the device elements;

receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element; and storing a pointer to the first unique point data structure in the first hierarchical point data structure, wherein when the selected first unique device element is a port, the method further comprises the steps of:

receiving a request from a client to generate an element list for the port, a type of the element list being chosen from the group including port, port instance, net segment, and instance, a traversal direction for the element list being chosen from a group consisting of next elements, previous elements, and a combination of next and previous elements;

generating the requested element list for the port; and returning the requested element list for the port to the client.

33. A computer implemented method of traversing a netlist that is arranged to represent an electronic device having a multiplicity of device elements, the method comprising the computer controlled steps of:

providing the hierarchical netlist arranged such that when one or more unique occurrences of separate but identical device elements exist in the electronic device, the hierarchical netlist maintains only a single definitive representation of the device elements;

receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element;

storing a pointer to the first unique point data structure in the first hierarchical point data structure;

receiving a request from a client to generate an element list for the port, a type of the element list being chosen from the group including port, port instance, net segment, and instance, a traversal direction for the element list being chosen from a group consisting of next elements, previous elements, and a combination of next and previous elements;

generating the requested element list for the port; and returning the requested element list for the port to the client, wherein the step of generating the requested element list for the port includes the substeps of:

determining a direction of the port; and if the direction of the port does not match the requested direction, generating an empty element list for returning to the requesting client.

34. A computer implemented method as recited in claim 33 wherein when (a) the direction of the port matches the requested direction and (b) the type of the requested element list is either port, port instance, or instance, the step of generating the requested element list for the port further includes the substeps of:

generating a second element list for a net segment electrically coupled to the port and present in the top module, the traversal direction and the element type for the second element list being the same as the requested element list; and creating the requested element list from the second element list by removing the port from the second element list, if present.

35. A computer implemented method of traversing a netlist that is arranged to represent an electronic device having a multiplicity of device elements, the method comprising the computer controlled steps of:

providing the hierarchical netlist arranged such that when one or more unique occurrences of separate but identical device elements exist in the electronic device, the hierarchical netlist maintains only a single definitive representation of the device elements;

receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element; and storing a pointer to the first unique point data structure in the first hierarchical point data structure, wherein when the selected first unique device element is a port instance, the method further includes the steps of:

receiving a request from a client to generate an element list for the port instance, a type of the element list being chosen from the group including port, port instance, net segment, and instance, a hierarchical direction of the element list being chosen from a group consisting of next elements, previous elements, and a combination of next and previous elements, a direction of the port instance being chosen from a group including input, output, and bi-directional a traversal direction being chosen from a group including towards a net associated with the port instance, towards an instance associated with the port instance, and bi-directional;

generating the requested element list for the port instance;

returning the requested element list to the client.

36. A method as recited in claim 35 wherein the traversal direction is determined as follows:

(a) towards the net if (i) the hierarchical direction is previous and the port instance direction is input, or (ii) the hierarchical direction is next and the port instance direction is output;

(b) towards the instance if (i) the hierarchical direction is next and the port instance direction is input, or (ii) the hierarchical direction is previous and the port instance direction is output; and (c) bi-directional if (i) the hierarchical direction is a combination of next and previous elements, or (ii) the port instance direction is bi-directional.

37. A method as recited in claim 35 wherein when the traversal direction is towards the net, the step of generating the requested element list includes the substeps of:

if the type of the element list is net, adding the net to the requested list;

if the type of the element list is not net, performing the steps of:

generating a second element list for the net, the second element list having a second type and a second hierarchical direction corresponding to the type and hierarchical direction of the requested element list; and adding each element in the second list to the requested list with the exception of the port instance, if the port instance is present in the second list.

38. A method as recited in claim 35 wherein the traversal direction is towards the instance, the step of generating the requested element list includes the substeps of:

returning a null element list if the type of the element list is port;

adding the instance to the requested list if the type of the element list is instance;

if the type of the element list is port instance, analyzing each pair of port instances associated with the port instance and the instance, each pair consisting of the port instance and a second port instance associated with the instance, and, when any given pair of port instances consisting of the port instance and a given second port effect one another electrically, adding the given second port to the requested list.

39. A method as recited in claim 35 wherein when the traversal direction is bi-directional, the step of generating the requested element list includes the substeps of:

if the type of the element list is net, adding the net to the requested list;

if the type of the element list is not net, performing the steps of:

generating a second element list for the net, the second element list having a second type and a second hierarchical direction corresponding to the type and hierarchical direction of the requested element list; and adding each element in the second list to the requested list with the exception of the port instance, if the port instance is present in the second list;

adding the instance to the requested list if the type of the element list is instance; and if the type of the element list is port instance, analyzing each pair of port instances associated with the port instance and the instance, each pair consisting of the port instance and a second port instance associated with the instance, and, when any given pair of port instances consisting of the port instance and a given second port effect one another electrically, adding the given second port to the requested list.

40. A computer implemented method of traversing a netlist that is arranged to represent an electronic device having a multiplicity of device elements, the method comprising the computer controlled steps of:

providing the hierarchical netlist arranged such that when one or more unique occurrences of separate but identical device elements exist in the electronic device, the hierarchical netlist maintains only a single definitive representation of the device elements;

receiving an identifier indicative of a selected first unique device element in the electronic device, the selected first unique device element being associated with a first single definitive representation of the selected first device element;

creating a first hierarchical point data structure that corresponds to the selected first unique device element;

creating a first unique point data structure that corresponds to the first unique device element, the step of creating including the substeps of:

allocating memory for the first hierarchical point data structure, the first hierarchical point data structure including a type field, a parent module pointer field, an element pointer field, a unique point list, and a bottom level flag;

storing a type identifier identifying an element type of the first hierarchical element in the type field, the element type chosen from the group including port, port instance, instance and net segment;

storing a pointer to a parent module of the first hierarchical element in the parent module pointer field;

storing a pointer to the first single definitive representation within the element pointer field;

creating a null list within the unique point list, the unique point list capable to identify a plurality of unique occurrences of a plurality of separate but identical selected first device elements; and setting the bottom level flag when the first hierarchical element is at the bottom of the traversable hierarchy of the hierarchical netlist; and storing a pointer to the first unique point data structure in the first hierarchical point data structure.

41. A method as recited in claim 40 wherein the first hierarchical element is determined to be at the bottom of the traversable hierarchy of the hierarchical netlist if the element type of the first hierarchical element is instance and the first hierarchical element contains no hierarchical elements.

42. A method as recited in claim 40 wherein the first hierarchical element is determined to be at the bottom of the traversable hierarchy of the hierarchical netlist if the first hierarchical element is listed on a client provided stoplist.

* * * * *